(12) United States Patent
Jones et al.

(10) Patent No.: US 12,340,404 B2
(45) Date of Patent: *Jun. 24, 2025

(54) SYSTEMS, METHODS, AND COMPUTER-READABLE MEDIA FOR GENERATING A MEMORIAL PRODUCT

(71) Applicant: MATTHEWS INTERNATIONAL CORPORATION, Pittsburgh, PA (US)

(72) Inventors: Pete Jones, Pittsburgh, PA (US); Patrick Charles Cox, Gibsonia, PA (US); Lamonica Jo Titchnell, Kingwood, WV (US)

(73) Assignee: Matthews International Corporation, Pittsburgh, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/449,980

(22) Filed: Jun. 24, 2019

(65) Prior Publication Data

US 2019/0392499 A1 Dec. 26, 2019

Related U.S. Application Data

(63) Continuation of application No. 14/470,881, filed on Aug. 27, 2014, now Pat. No. 10,332,173.
(Continued)

(51) Int. Cl.
*G06Q 30/06* (2023.01)
*E04H 13/00* (2006.01)
(Continued)

(52) U.S. Cl.
CPC ....... *G06Q 30/0621* (2013.01); *E04H 13/001* (2013.01); *E04H 13/003* (2013.01);
(Continued)

(58) Field of Classification Search
CPC .......... G06Q 30/0621; G06Q 30/0643; G06Q 30/0635; G06F 30/13; E04H 13/001; E04H 13/008; E04H 13/003
(Continued)

(56) References Cited

U.S. PATENT DOCUMENTS 4,412,799 A 11/1983 Gates
4,945,498 A 7/1990 Mitamura
(Continued)

FOREIGN PATENT DOCUMENTS

CA 2324822 A1 4/2001
CA 2860738 A1 2/2015
(Continued)

OTHER PUBLICATIONS

Engine Bergeron, Susan J.; "Preview Engaging the Virtual Landscape: Toward an Experiential Approach to Exploring Place Through a Spatial Experience"; ProQuest Dissertations and Theses ProQuest Dissertations Publishing. (2011); retrieved from Dialog database on Sep. 15, 2022. (Year: 2011).*
(Continued)

*Primary Examiner* — Yogesh C Garg
(74) *Attorney, Agent, or Firm* — DLA Piper LLP

(57) ABSTRACT

Systems, methods, and computer-readable media for generating memorial products using a memorial product design and ordering system (the "design system"). The design system may generally be configured to provide users with a platform, tools, design elements, automated processes, and/or the like for designing, customizing and ordering memorial products. The design system may be configured to present users with graphical or virtual representations of physical memorial products ("virtual product templates") that may be customized by specifying product characteristics and adding various design elements. In some embodi-
(Continued)

ments, the virtual product templates may be and/or may include photo-realistic and/or three-dimensional (3D) representations of the actual physical memorial products. In this manner, the design system may be configured to provide a customer with a realistic user experience from a virtual and/or online design tool.

21 Claims, 23 Drawing Sheets

Related U.S. Application Data

(60) Provisional application No. 61/954,491, filed on Mar. 17, 2014, provisional application No. 61/870,731, filed on Aug. 27, 2013.

(51) Int. Cl.
*G06F 30/13* (2020.01)
*G06Q 30/0601* (2023.01)
*A61G 99/00* (2006.01)

(52) U.S. Cl.
CPC ......... *G06F 30/13* (2020.01); *G06Q 30/0635* (2013.01); *A61G 99/00* (2013.01)

(58) Field of Classification Search
USPC .................................. 705/26.5, 26.81, 27.2
See application file for complete search history.

(56) References Cited

U.S. PATENT DOCUMENTS

| | | | |
|---|---|---|---|
| 5,202,793 A | 4/1993 | Auge | |
| 5,293,479 A * | 3/1994 | Quintero | G06F 30/00 706/919 |
| 5,822,209 A | 10/1998 | Fischer | |
| 6,026,377 A | 2/2000 | Burke | |
| 6,414,663 B1 | 7/2002 | Manross, Jr. | |
| 6,664,125 B2 | 12/2003 | Watanabe et al. | |
| 6,768,928 B1 | 7/2004 | Nagasawa et al. | |
| 6,823,227 B2 | 11/2004 | Yamada et al. | |
| 6,916,436 B2 | 7/2005 | Tabula | |
| 6,917,905 B2 | 7/2005 | Asana et al. | |
| 6,950,713 B2 | 9/2005 | Walthall | |
| 7,254,666 B2 | 8/2007 | Toothman, III | |
| 7,393,485 B2 | 7/2008 | Yourist | |
| 7,448,020 B2 | 11/2008 | Kohno | |
| 7,526,360 B2 | 4/2009 | Oshitani et al. | |
| 7,751,066 B2 | 7/2010 | Iwasaki | |
| 7,759,049 B2 | 7/2010 | Yamada et al. | |
| 7,797,070 B2 | 9/2010 | Dilback, Jr. et al. | |
| 7,894,924 B2 | 2/2011 | Proudfoot | |
| 8,234,251 B2 | 7/2012 | Mindrum | |
| 10,332,173 B2 | 6/2019 | Jones et al. | |
| 10,546,311 B1 * | 1/2020 | Gupta | G06Q 30/0204 |
| 2001/0025459 A1 | 10/2001 | Barnes | |
| 2002/0032498 A1 | 3/2002 | Mattke et al. | |
| 2002/0073380 A1 * | 6/2002 | Cooke | G06F 30/30 716/102 |
| 2002/0123812 A1 * | 9/2002 | Jayaram | G06T 19/20 345/475 |
| 2003/0138706 A1 * | 7/2003 | Progler | G03F 9/00 430/5 |
| 2003/0156139 A1 * | 8/2003 | Kimura | G06F 30/00 715/804 |
| 2003/0233162 A1 | 12/2003 | Kawai et al. | |
| 2004/0148282 A1 | 7/2004 | Gardiner | |
| 2004/0175669 A1 * | 9/2004 | Abels | A61C 7/146 433/24 |
| 2007/0190256 A1 | 8/2007 | Darby et al. | |
| 2008/0154413 A1 | 6/2008 | Proudfoot | |
| 2009/0319974 A1 * | 12/2009 | Allen | G06F 30/30 716/122 |
| 2011/0062132 A1 * | 3/2011 | Raje | G06F 30/23 219/137 R |
| 2011/0063415 A1 | 3/2011 | Gefen et al. | |
| 2011/0137758 A1 * | 6/2011 | Bienias | G06Q 30/0621 705/27.2 |
| 2012/0090005 A1 | 4/2012 | Marlow et al. | |
| 2012/0176402 A1 * | 7/2012 | Kim | G06T 17/00 345/619 |
| 2012/0192077 A1 | 7/2012 | Castellani et al. | |
| 2012/0278121 A1 | 11/2012 | Bateman et al. | |
| 2012/0281013 A1 * | 11/2012 | Mahdavi | G06F 3/04817 345/619 |
| 2013/0060655 A1 * | 3/2013 | Trounce | G06Q 30/0621 705/26.5 |
| 2013/0124311 A1 * | 5/2013 | Sivanandan | G06Q 30/02 705/14.51 |
| 2013/0144733 A1 * | 6/2013 | Rothschild | G06Q 20/0457 705/17 |
| 2013/0275886 A1 * | 10/2013 | Haswell | H04L 12/1822 715/757 |
| 2013/0290137 A1 * | 10/2013 | Olomskiy | G06Q 30/06 705/26.5 |
| 2014/0299662 A1 | 10/2014 | Harrison | |
| 2014/0366005 A1 * | 12/2014 | Kozhuharov | G06F 11/3696 717/125 |
| 2015/0058175 A1 * | 2/2015 | Axt | H04N 21/8355 705/26.81 |
| 2015/0066681 A1 | 3/2015 | Jones et al. | |

FOREIGN PATENT DOCUMENTS

| | | | | |
|---|---|---|---|---|
| GB | 2519647 A | | 4/2015 | |
| JP | 3415438 B2 | * | 6/2003 | ............. G06T 17/00 |
| KR | 940015909 A | * | 7/1994 | ............. G06F 30/30 |
| KR | 20130045584 A | * | 5/2013 | ............. G06F 17/50 |
| WO | 2008/134707 A1 | | 11/2008 | |

OTHER PUBLICATIONS

Murphy, Patrick Joseph;"Preview Design and control of a 2 degree of freedom upper limb robotic rehabilitation device"; ProQuest Dissertations and Theses ProQuest Dissertations Publishing. (2013); retrieved from Dialog database on Sep. 15, 2022. (Year: 2013).*

Su, C J; Lin, F H; Ye, L ; "A new collision detection method for CSG-represented objects in virtual manufacturing"; Computers in Industry40.1: 1-13. Elsevier Science BV. (Sep. 1999); retrieved from Dialog on Apr. 7, 2023 (Year: 1999).*

Su, C J; Lin, F H; Ye, L ; "A new collision detection method for CSG-represented objects in virtual manufacturing"; Computers in Industry40.1: 1-13. Elsevier Science BV. (Sep. 1999), pp. 1-13 ; retrieved from Dialog on Oct. 31, 2023 (Year: 1999).*

Article, "Matthews International Corporation Acquires Reproservice Eurodigital GmbH Munchen"; PR Newswire [New York] Aug. 12, 2003: 1.; retrieved from Dialog on Feb. 4, 2025 (Year: 2003).*

"Headstone", http://web.archive.org/web/20130705141835 /http:// www. headstonesandmemorials.com/ord.php. Archived Feb. 18, 2013 by use of Internet Archive Wayback Machine Pages.

* cited by examiner

FIG. 8

SYSTEMS, METHODS, AND COMPUTER-READABLE MEDIA FOR GENERATING A MEMORIAL PRODUCT

CROSS-REFERENCE TO RELATED APPLICATIONS

This application is a continuation of U.S. Pat. No. 10,332,173, filed on Aug. 27, 2014, which claims the benefit of U.S. Provisional Application No. 61/870,731, filed on Aug. 27, 2013, and U.S. Provisional Application No. 61/954,491, filed on Mar. 17, 2014. The contents of each of the above are incorporated by reference in their entirety as if fully set forth herein.

BACKGROUND

The process for ordering memorialization and architectural products, such as plaques, signage, grave markers, or the like remains largely a manual process. In general, customers fill out paper order forms at the premises of a vendor and/or mail or fax completed order forms to a manufacturer. This process, for both vendor and customer, is tedious and error-prone and often causes the vendor to miss out on sales opportunities. Technological advances have introduced computer forms and web-based interfaces for entering customer orders. However, these still require a customer to make numerous selections and to navigate through several, if not all, pages of options in order to view choices that may be of interest. As such, computer-based ordering systems remain inefficient and do not operate to actually enhance sales for vendors. Accordingly, a system that allows a customer to effectively access design choices of interest and to customize a product would greatly benefit the memorialization and architectural products industries.

SUMMARY

This disclosure is not limited to the particular systems, devices and methods described, as these may vary. The terminology used in the description is for the purpose of describing the particular versions or embodiments only, and is not intended to limit the scope.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention. As used in this document, the term "comprising" means "including, but not limited to."

In an embodiment, a system for generating a memorial product may include a processor and a non-transitory, computer-readable storage medium in operable communication with the processor. The computer-readable storage medium may contain one or more programming instructions that, when executed, cause the processor to receive subject information and customer information, generate at least one virtual memorial product based on the subject information and the customer information, the at least one virtual memorial product comprising at least one memorial product template and at least one virtual design element selected based on the subject information and the customer information, and generate an order for a memorial product based on the at least one virtual memorial product.

In an embodiment, a system for generating a memorial product may include a processor and a non-transitory, computer-readable storage medium in operable communication with the processor. The computer-readable storage medium may contain one or more programming instructions that, when executed, cause the processor to generate a virtual memorial product in response to receiving a memorial product template selection from a client logic device, add at least one virtual design element to the virtual memorial product using at least one design function in response to receiving at least one design element selection from the client logic device, wherein the at least one design function comprises at least one of a snap-to-grid design function, a target location design function, a collision detection design function, and a placeholder design function, and generate an order for a memorial product based on the at least one virtual memorial product.

In an embodiment, a system for generating a memorial product may include a processor and a non-transitory, computer-readable storage medium in operable communication with the processor. The computer-readable storage medium may contain one or more programming instructions that, when executed, cause the processor to receive subject information, and generate at least one virtual memorial product based on the subject information, the at least one virtual memorial product comprising at least one memorial product template and at least one design element selected based on the subject information.

In an embodiment, a system for generating a memorial product may include a processor and a non-transitory, computer-readable storage medium in operable communication with the processor. The computer-readable storage medium may contain one or more programming instructions that, when executed, cause the processor to generate a virtual memorial product in response to receiving a memorial product template selection from a client logic device, and add at least one design element to the virtual memorial product using at least one design function in response to receiving at least one design element selection from the client logic device, wherein the at least one design function comprises at least one of a snap-to-grid design function, a target location design function, a collision detection design function, and a placeholder design function.

In an embodiment, a system for generating a memorial product may include a processor and a non-transitory, computer-readable storage medium in operable communication with the processor. The computer-readable storage medium may contain one or more programming instructions that, when executed, cause the processor to receive product information defining at least one memorial product, and generate at least one virtual memorial product template based on the product information, the at least one virtual memorial product template being configured to graphically depict the at least one memorial product.

In an embodiment, a computer-readable storage medium having computer-readable program code configured for generating a memorial product embodied therewith may include computer-readable program code configured to receive subject information and generate at least one virtual memorial product based on the subject information, the at least one virtual memorial product comprising at least one memorial product template and at least one virtual design element selected based on the subject information.

BRIEF DESCRIPTION OF THE DRAWINGS

The above and other objects of the present invention will become more readily apparent from the following detailed description taken in connection with the accompanying drawings.

FIGS. 6-22 depict various illustrative user interfaces for a design system according to some embodiments.

DETAILED DESCRIPTION

Figure 1:
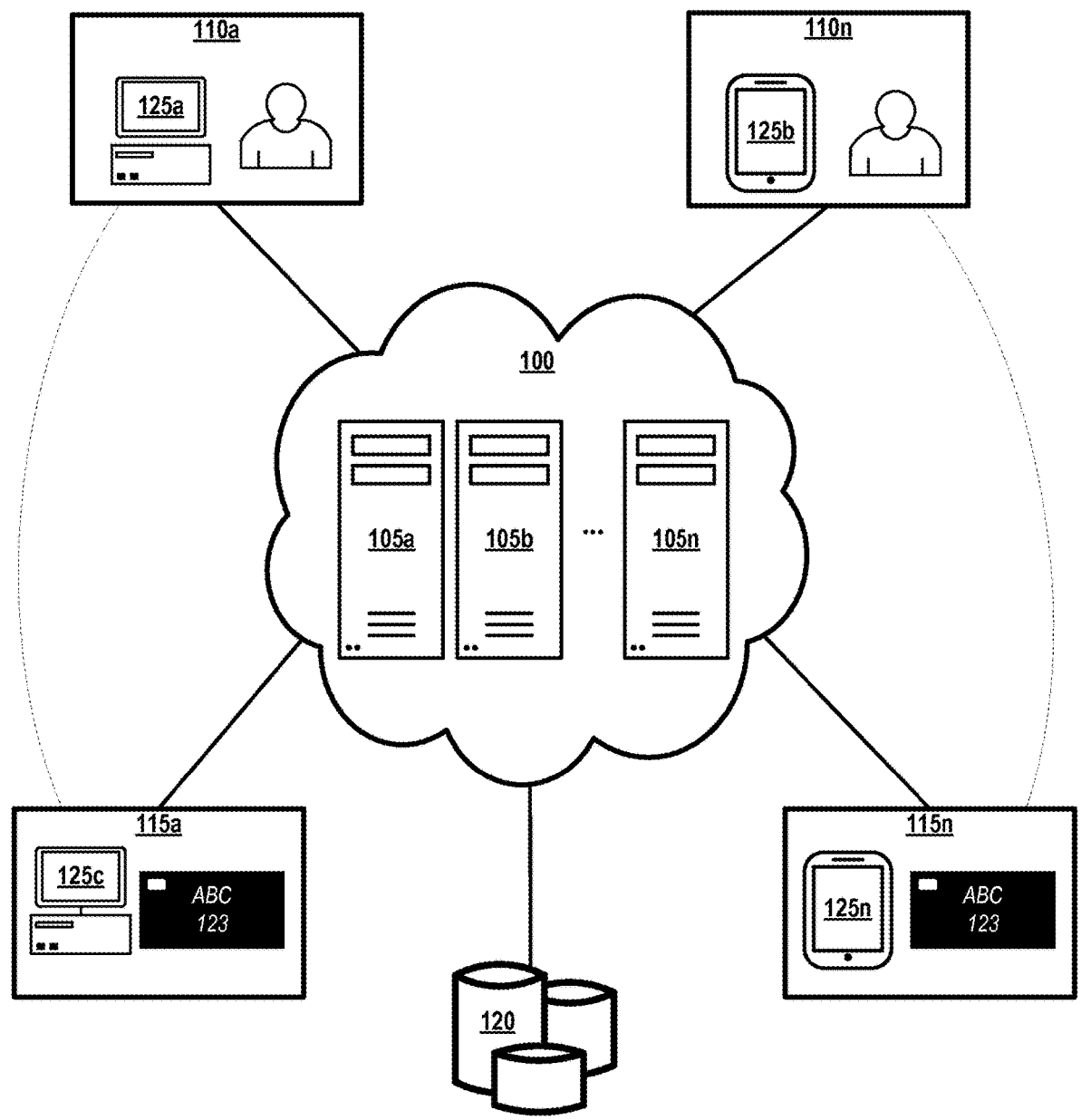
FIG. 1 depicts an illustrative memorial product design system according to some embodiments.

The described technology generally relates to systems, methods and computer-readable media for generating memorial products. In general, a memorial product design and ordering system (the "design system") may be configured to provide users with a platform, tools, design elements, automated processes, and/or the like for designing, customizing and ordering memorial products. The design system may be configured to present users with graphical or virtual representations of physical memorial products ("virtual product templates") that may be customized by specifying product characteristics and adding various design elements ("virtual design elements"). In some embodiments, the virtual product templates may be and/or may include photo-realistic and/or three-dimensional (3D) representations of the actual physical memorial products. In this manner, the design system may be configured to provide a customer with a realistic user experience from a virtual and/or online design tool.

In some embodiments, the design system may receive information associated with a user, potential order, customer, subject, patron, or a combination thereof and may automatically generate a virtual product template that includes certain product characteristics and/or design elements selected based on the information associated with a user, potential order, customer, subject, patron, or combination thereof. The design system may include accounts or user profiles for certain users. The accounts may be associated with certain user information, such as information pertaining to user identification, location, preferences, product types, account type, and/or the like. In an embodiment, users may access the design system through a user-specific access interface and may be presented with virtual product templates, design elements, design tools, and/or the like specified based on their associated user information.

The design system described according to some embodiments provides multiple technological advantages and technical effects on processes and techniques, including processes and techniques external to the design system. Using conventional techniques, designing and ordering memorial products is primarily a manual process. For example, purchasers may look at products and design features separately in catalogs or through digital images. However, the purchasers generally are not able to manipulate the images nor view the combination of memorial products and design elements (for example, a particular border and finish on a particular headstone). Accordingly, purchasers are not able to adequately realize what the finished product will actually look like. In addition, purchasers are not able to directly manipulate, change, or otherwise modify memorial products during the creation and ordering process. One non-limiting technological advantage and technical effect of the design system according to some embodiments is that the design system may allow purchasers to view dynamic, realistic representations of memorial products with design elements in substantially real-time. In contrast, conventional techniques only allow for the visualization of static images of products and design elements. Another non-limiting technological advantage and technical effect of the design system according to some embodiments is that the design system may allow purchasers to modify the design of the memorial product in substantially real time. For instance, a purchaser may select a memorial product and view different finishes, symbols, or other design elements on the memorial product simultaneously and in substantially real-time. A further non-limiting technological advantage and technical effect of the design system according to some embodiments is that the design system may provide insightful recommendations for memorial products and/or design information based on certain information, such as subject information (for instance, the subject of the memorial product, such as the deceased for a grave marker), customer information (for instance, a cemetarian or funeral director), purchaser information, or the like, or combinations thereof. In this manner, the design system according to some embodiments may operate to improve the memorial product design process by making the process more efficient, accurate, and cost-effective and may improve the user experience of purchasers designing and ordering memorial products.

FIG. 1 depicts an illustrative memorial product design system according to some embodiments. As shown in FIG. 1, a memorial product design system ("design system") 100 may include one or more computing devices 105a-105n, such as server computing devices, arranged in a network. The one or more computing devices 105a-105n may generally include a processor, a non-transitory memory or other storage device for housing programming instructions, data or information regarding one or more applications, and other hardware, including, for example, the central processing unit (CPU) 2305, read only memory (ROM) 2310, random access memory 2315, communication ports 2340, controller 2320, and/or memory device 2325 depicted in FIG. 23 and described below in reference thereto.

According to some embodiments, the programming instructions may include a design application configured to design a memorial product as described in more detail below. The design application may be accessible through various platforms, including, without limitation, a client application, a web-based application, an Internet-based application, and/or a mobile application (for example, a "mobile app" or "app").

The design system 100 may communicate with customers 110a-110n, manufacturers 115a-115n, or any other type of user through the design application using various logic devices 125a-125n (client logic devices or client computing devices), including, but not limited to, any logic and/or computing device now known or developed in the future, such as a server, a personal computer (PC), a laptop computer, a notebook computer, a personal digital assistant (PDA), a tablet computing device, a kiosk computing system, a smartphone, and/or the like. In some embodiments, the design system 100 may include and/or may be in communication with enterprise and/or business analytics software, including, without limitation, the SAP® family of software provided by SAP® AG of Walldorf, Baden-Württemberg, Germany, the Websphere® family of software provided by the International Business Machines Corporation, and/or any configuration or design application associated therewith. In such embodiments, information used and/or generated through the design system 100 may be retrieved from and/or stored through the enterprise and/or business analytics software. In some embodiments, the design system 100 may be configured to communicate with and/or be integrated with various design tools, such as manufacturer design tools and/or customer design tools, including, without limitation, software design tools, computer-implemented design tools, manufacturing devices and equipment, or any combination thereof.

The logic devices 125a-125n may communicate with the design system 100 using various wired and/or wireless communication platforms known to those having ordinary skill in the art or developed in the future, such as Ethernet (Institute of Electrical and Electronics Engineers (IEEE) 802.3, and/or the like), Wi-Fi (for example, IEEE 802.11g, 802.11n, and/or the like), local area network (LAN), wide area network (WAN), serial, plain old telephone system (POTS), third generation mobile telecommunications technology (3G), fourth generation mobile telecommunications technology (4G), long-term evolution mobile telecommunications technology (LTE), satellite communications, and any combination thereof.

Customers 110a-110n (or other users) may interact with the design application to, among other things, design virtual memorial products and to order memorial products based on the virtual memorial products. In an embodiment, at least a portion of the information and/or modules (see FIG. 3) required for operation of the design application may be stored on a logic device 125a-125n such that the design application, or a client version thereof, may be used in an "offline" mode. The design application may generate storage objects for storing information associated with virtual memorial products designed by customers 110a-110n. The storage objects may have various forms, including, without limitation, electronic files, image files, audio files, multimedia files, databases, database records, word processing files, spreadsheet files, and/or the like. Memorial products designed and ordered by customers 110a-110n may be transmitted as storage objects, either through the design system 100 or through the customers directly, to manufacturers 115a-115n that will produce a physical memorial product based, at least partially, on information included in the virtual memorial product.

For example, a customer 110a-110n may design a virtual memorial product in the form of a plaque having various text and images using the design application. The virtual memorial product may be saved by the design system, for example and without limitation, as a bitmap file or as a bitmap file and an associated extensible markup language (XML) file. The bitmap file may be transmitted over the Internet to a manufacturer 115a-115n along with certain order information, such as a customer name, a shipping address, and payment information. The manufacturer 115a-115n may produce the plaque based on the virtual memorial product produced by the customer 110a-110n and may ship the plaque to the address specified in the order information. In some embodiments, the design system may save the virtual memorial product in any form capable of being read, processed, managed, or otherwise used by a computing system known to those having ordinary skill in the art or developed in the future, including proprietary file and/or data formats used by various manufacturers.

In an embodiment, the design application may be configured to generate various three-dimensional (3D) virtual memorial products based on a virtual memorial product created by a customer 110a-110n. For example, the design application may include and/or may access various software modules, applications, or the like configured to use the information associated with the virtual memorial product (including two-dimensional (2D) information) to generate a 3D image thereof. The 3D image may be used by the customer to further customize the virtual memorial product (or to "shop" using the design system 100), to share (for example, through the Internet, such as through a social networking service), or any other use consistent with some embodiments of the design system. The 3D image files may include any type of 3D file types now know to those having ordinary skill in the art or developed in the future, including, without limitation, *.3d, *.3d2, *.3d4, *.3da, *.3df, *.cmf, *.crf, *.des, *.fbx, *.p3d, *.p3l, *.p3m, *.p3r. In another embodiment, the design system 100 may be in operable communication with a 3D printing device configured to print a 3D solid object based on a virtual memorial product created by a customer 110a-110n within the design system.

In an embodiment, the design system 100 may be in communication with various third-party resources 120 that may be used by the design application for various functions. For instance, the third-party resources 120 may include external databases that may provide design elements, text, information, and/or the like. In another instance, the third-party resources 120 may include various software applications, including Internet services, such as multimedia services, social networking services, e-commerce services, payment processing services, shipping services, manufacturer websites, customer websites, information storage systems, and/or the like.

In an embodiment, various components of the design system 100 may be operated by and/or hosted by an operator on behalf of an entity that commercially sells the memorial products (the "memorial product vendor"). For example, an Internet-based, cloud-based and/or information technology (IT) entity may operate and/or host some or all aspects of the design system 100 on behalf of the memorial product vendor that is selling the physical memorial products to customers 110a-110n.

Figure 2:
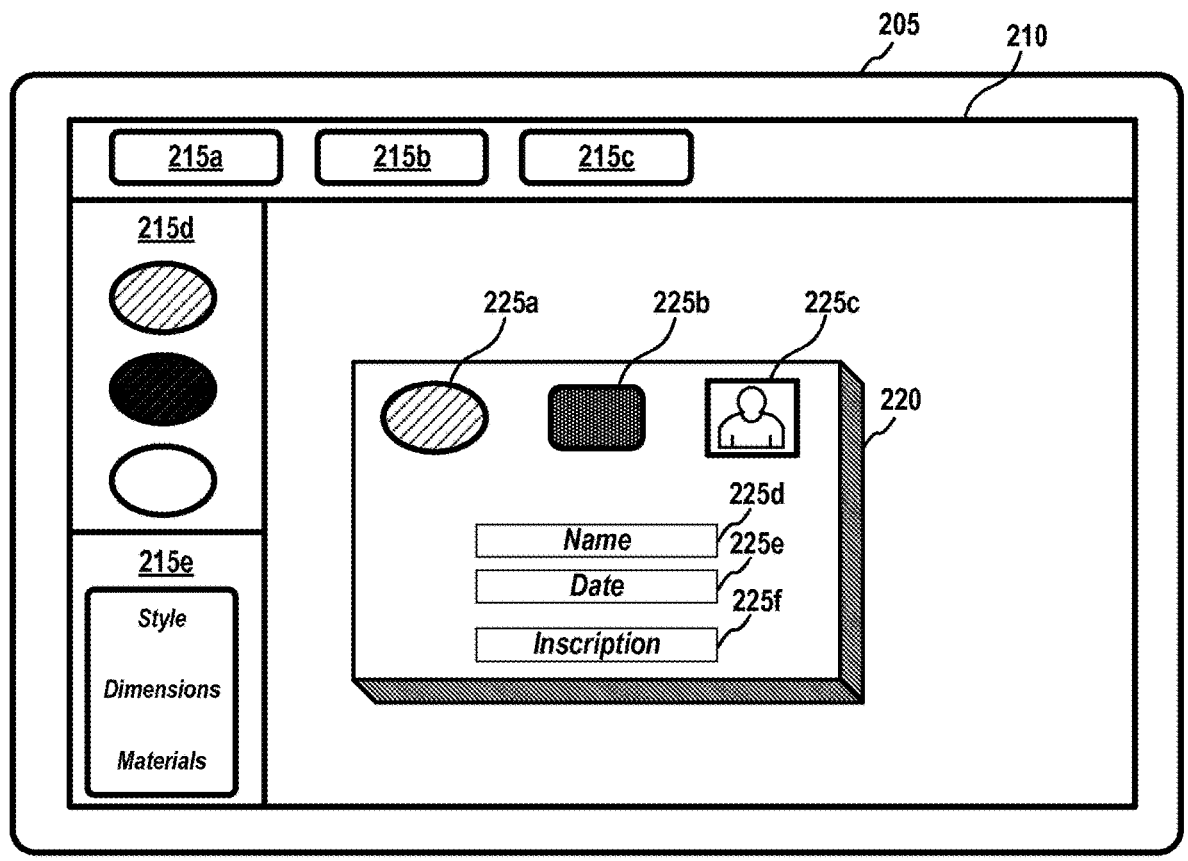
FIG. 2 depicts a memorial design interface of a design system according to an embodiment.

FIG. 2 depicts a memorial design interface of a design system according to an embodiment. As shown in FIG. 2, a display component 205 may present a memorial design interface 210 implemented through the design application. The display component 205 may be operably coupled to one or more logic devices, such as logic devices 125a-125n. The memorial design interface 210 may include various graphical user interface (GUI) design objects 215a-215e configured to allow a user to design a virtual memorial product 220 that represents a physical memorial product that can be produced based on the virtual memorial product.

A memorial product may include various articles manufactured to be ornamental, decorative, architectural, commemorative, patterned, celebrative, identifying, and/or the like. Non-limiting examples of memorial products may include grave markers, headstones, urns, vases, plaques, medals, trophies, awards, sculptures, statues, signs, pictures, displays, scrolls, granite, niche plates, crypt plates, urns, caskets, and any combination thereof. The memorial product may include various materials, including stone, wood, metal, plastic, glass, precious stones, electronic elements, and any combination thereof. In some embodiments, the memorial product may include a bronze memorial product. In some embodiments, the bronze memorial product may include a cast bronze memorial product, such as a cast bronze plaque, grave marker, or the like. In some embodiments, the memorial product may include a bronze, cast bronze, or non-bronze memorial product produced and/or sold by Matthews® International Corporation of Pittsburgh, PA, United States. In some embodiments, a memorial product may be configured to represent, symbolize, celebrate, commemorate, or otherwise memorialize a life or entity (for example, a corporation, a municipality, or the like) event, including, without limitation, an anniversary, a wedding, a birth, a death, an award, and a dedication.

In an embodiment, certain of the GUI design objects 215a-215c may include various design application menu selection options, including, without limitation, project and/or file manipulation functions (for example, create new, open, import, close, properties, edit, and/or the like), navigation functions, ordering functions (for example, check out, catalog access, shopping cart, and/or the like), virtual memorial product save functions (for example, save, save as, save as a particular file type(s), export, and/or the like), and/or the like. In an embodiment, certain of the GUI design objects 215a-215c may include various memorial product selection options, including, without limitation, selecting the type and or characteristics of the memorial product such as layout, text, design elements, signatures (for example, a digital copy of a signature), images (for example, cameos, digital images, photographs, and/or the like), colors, borders, edging, accessories (for example, a vase for a grave marker, including an embedded vase), add-ons, adornments, decorations, fixtures, ornaments, and/or the like.

The design application may present various customization windows 215d, 215e responsive to selection of a GUI design object 215a-215c. The customization windows 215d, 215e may be configured to allow for the selection of various design elements and/or design characteristics. For example, a "text" customization window 215d, 215e may be presented responsive to selection of a GUI design object 215a-215c, such as a corresponding "text" GUI design object. The text customization window 215d, 215e may be configured to provide various graphical objects for entering text to include on the virtual memorial product 220 (such as design elements 225d-225f) and/or to specify characteristics of the text such as font, size, color, outline, effects (for example, shadow effects), specialized fonts and/or characters (such as Hebrew, Greek, Chinese, Japanese, or the like), any combination thereof, and/or the like. In another example, a "product type" customization window 215d, 215e may allow for the selection of the type of memorial product as the memorial product template of the virtual memorial product 220, such as grave markers, headstones, urns, vases, plaques, medals, trophies, awards, sculptures, statues, signs, pictures, displays, or any combination thereof.

In a further example, a "design elements" customization window 215d, 215e may allow for the selection of various design elements 225a-225f that may be included on the virtual memorial product 220. The design elements (or "virtual design elements") 225a-225f may include any type of graphical and/or textual element that may be included on a memorial product. Illustrative and non-restrictive examples of design elements 225a-225f may include text (for example, names, dates, inscriptions, verses, phrases, quotes, poems, and/or the like), images (for example, photographs, pictures, cameos, and/or the like), emblems (for example, civic or military emblems), logos, symbols, religious symbols, symbols of affiliation, signatures (for example, an image based on a digital copy of a signature), ornaments, patterns, designs, colors, textures, electronic device- and/or computer-readable elements (for example, a quick response (QR) code, a bar code, a radio-frequency identification (RFID) element, augmented reality apps, global positioning system elements, invisible ink, optical ink, Touchcode, and/or the like), and any combination thereof.

The design elements 225a-225f may be added to a virtual memorial product 220, edited, or otherwise manipulated using various design functions. For example, in some embodiments, the design elements 225a-225f may be added to a virtual memorial product 220 using a "snap-to-grid" design function, a "snap-to-object" design function, and/or any other function which generally aligns, positions, "snaps," or otherwise assists in accurately and efficiently placing design elements 225a-225f on the virtual memorial product. In some embodiments, a design element may be aligned (or "snapped") to one or more objects or locations, such as previously placed design elements (for example, to be aligned therewith) and/or gridlines associated with the virtual memorial product 220 and/or the design elements 225a-225f.

In some embodiments, the design elements 225a-225f may include a placeholder design function configured to represent an object that is not in the design system (i.e., not included in a system design element inventory) and/or cannot be represented in the design system using a placeholder element. When selecting a placeholder element, a user may provide various characteristics, such as a name, description, shape, size, color, or the like. In this manner, the design system may generate a placeholder element that is configured to approximate the actual object that the placeholder element represents. The placeholder element may be used as a placeholder until the time that the object may be added to the available design elements 225a-225f and/or the manufacturer creates the physical memorial product using the actual object represented by the placeholder. For example, the placeholder element may be selected to represent an emblem from a particular group that is not in a catalogue or population of available design elements 225a-225f, such as a crest emblem. A user may select the placeholder element, enter information associated with the crest emblem, and place the placeholder element on the virtual memorial product 220 as a design element 225a-225f.

In some embodiments, the design application may be configured to determine various target locations for the placement of a design element 225a-225f on the virtual memorial product 220 through a target location design function. The target locations may be based on various factors, including, without limitation, customary placement locations, templates, the placement of other design elements 225a-225f, or any combination thereof. In some embodiments, when a user selects a design element 225a-225f, a target location may appear on the virtual memorial product 220 signifying to the user where the design element 225a-225f may be placed (for example, suggested placement locations) and/or is able to be placed (for example, available areas based on the configuration of the virtual memorial product 220 and/or the design element 225a-225f). For example, a user may select to add a handwritten signature design element 225a-225f to a grave marker. The design application may provide one or more target locations on the virtual memorial product 220 for the grave marker, for example, through shading/coloring target areas of the grave marker, providing target symbols, presenting the grave marker with the digital signature in one or more target locations, any combination thereof, or the like. For example, a target location for the handwritten signature may be determined based on the size and/or shape of the handwritten signature because the handwritten signature may only fit in certain locations. In another example, a target location may be displayed that provides customary locations for placement of the handwritten signature, for instance, based on historical data, user-provided instructions, and/or customer specified locations.

In some embodiments, the design application may provide a collision detection design function configured to prevent "collisions" or touching of design elements 225*a*-225*f* and/or to ensure that there is adequate space between design elements 225*a*-225*f* placed on a virtual memorial product 220. In some embodiments, when a user places a design element 225*a*-225*f* on a virtual memorial product 220, the collision detection design function may monitor for any potential collision between the design element being placed on the virtual memorial product and any design elements previously placed on the virtual memorial product. In some embodiments, a collision may include the touching or overlapping of design elements 225*a*-225*f*, design elements being within a threshold distance of each other, and/or a portion of a design element being off of the virtual memorial product 220.

In some embodiments, a "memorial product characteristics" customization window 215*d*, 215*e* may allow for the selection of a memorial product template (for example, the graphical representation of the memorial product base) and/or various characteristics of the memorial product, including, without limitation, physical characteristics. Non-limiting examples of characteristics include, borders, edging, texture, material type, material quality, dimensions, size, weight, orientation, finishes, coatings, and/or the like.

Embodiments are not limited to the GUI design objects 215*a*-215*c*, customization windows 215*d*, 215*e* and/or the form and/or arrangement thereof as depicted in FIG. 2 as these are for illustrative purposes only. For instance, any form of GUI design object 215*a*-215*c* and/or customization window 215*d*, 215*e* capable of operating the design application and/or designing a memorial product according to some embodiments is contemplated herein.

As shown in FIG. 2, a user may create a virtual memorial product 220 through the memorial design interface 210. For example, a user may access the memorial design interface 210 and create a new project, including selecting a type of memorial product and various characteristics thereof. The design application may present the user with a virtual memorial product 220 on the memorial design interface 210. Through the GUI design objects 215*a*-215*c* and the customization windows 215*d*, 215*e*, the user may step through the design process by adding design elements to the virtual memorial product 220 (by placing them on the memorial product template), customizing the design elements, and customizing characteristics of the memorial product. The user may save the virtual memorial product 220 as a storage object and may order the memorial product. The storage object may be accessed by an entity, such as the memorial product vendor and/or a manufacturer 115*a*-115*n*, to produce the physical memorial product. The virtual memorial product 220 may be manipulated by the user through various tools provided within the design system 100, including, without limitation, through the memorial design interface 210. For example, a user may turn, rotate, or otherwise change the spatial orientation of the virtual memorial product 220. In another example, a user may zoom in and/or out of the virtual memorial product 220 to see the virtual memorial product at various zoom levels. Such a zoom function may allow a user to see every inch of the virtual memorial product 220 in detail.

In some embodiments, the memorial design interface 210 may be configured to present the virtual memorial product 220 within the actual or anticipated placement location. In this manner, virtual memorial product 220 may be displayed to a user depicting how the physical memorial product may look in the actual placement location. In some embodiments, the design application may have access to particular placement locations and/or general representations of placement locations. For example, the design application may access various maps and/or graphical images for a cemetery depicting cemetery plots. In another example, the design application may access generic images that depict typical placement locations. As such, the memorial design interface 210 may show a user how a virtual memorial product 220 may look in the particular placement location and/or a generic placement location. In this manner, a customer may be able to get a sense of the size, aesthetics, or the like for the physical memorial product when it is actually installed.

A user may include various types of customers of the operator or memorial product vendor, described above, of the design system 100. For instance, a customer may be a direct purchaser of a memorial product. In another instance, the customer may include an entity purchasing a memorial product on behalf of a patron. For example, the customer may include a funeral services business or cemetarian purchasing a grave marker on behalf of a patron of the funeral services. Although a funeral services business may be used as an example herein, embodiments are not so limited, as the design system 100 and the various functions and features thereof may be used for any industry, business, or the like, capable of operating according to some embodiments, such as the cremation industry and the architectural products industry.

Figure 3:
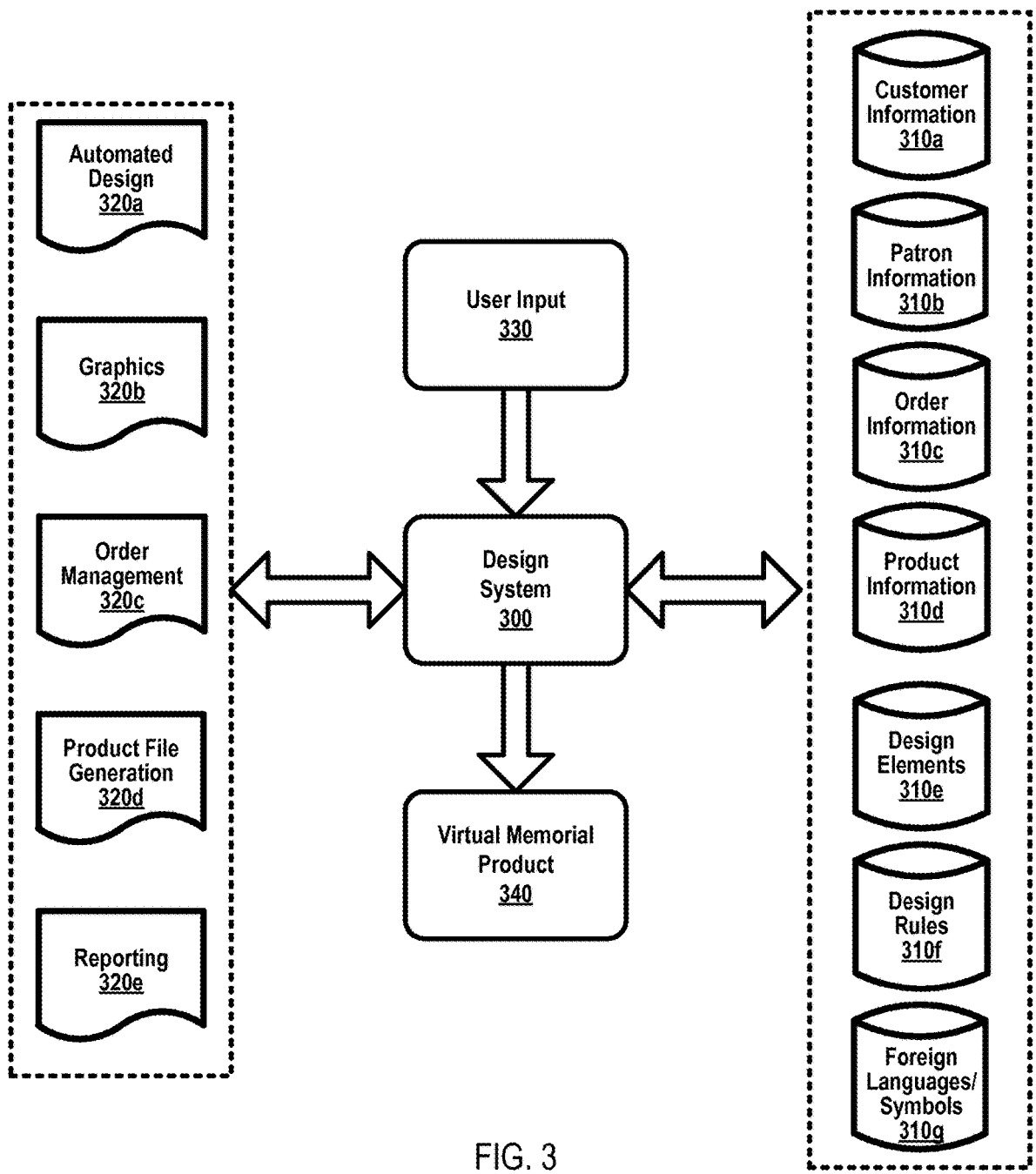
FIG. 3 depicts an illustrative design system according to some embodiments.

FIG. 3 depicts an illustrative design system according to some embodiments. As shown in FIG. 3, a design system 300 may access, manage, use, or otherwise interact with various information sources 310*a*-310*h* to generate virtual memorial products, process orders, and/or the like. A customer information source 310*a* may include information ("customer information") about customers that design and/or order memorial products using the design system 300. Information in the customer information source 310*a* may include a name, an address, a business type, customer account numbers, usernames, passwords, approved product types, approved product designs, memorial product design historical data, memorial product order historical data, financial information, order statuses, affiliated businesses, sales territory, and/or any other type of information associated with a customer that may be used to design and/or order a memorial product. According to some embodiments, sales territory information may include geographical sales information, regional sales information, and/or installation locations of purchased memorial products, such as businesses and/or educational institutions for a sign manufacturer customer or cemeteries for a funeral services customer. In some embodiments, a customer may include an owner or operator of a cemetery (a "cemetarian"), funeral home, or other death services industry entity (i.e., a customer of a memorial product manufacturer). As such, the customer may not be the end purchaser of a memorial product. For example, the customer may purchase the memorial product from a manufacturer and may sell the memorial product to a patron of the customer.

Patron information 310*b* may include any information about patrons, for instance, that are the actual end-purchaser of a memorial product. In general, a patron may be a relative or loved one of a deceased purchasing a memorial product to memorialize the deceased (for instance, a gravestone or funeral marker). The patron may purchase the memorial product through a customer, such as a cemetarian or a funeral director. In some embodiments, the patron may design and purchase a memorial product directly from a memorial product manufacturer without going through a customer. For instance, the patron may access the design application through their own logic device to design and order a memorial product. In some embodiments in which the patron purchases directly from the memorial product manufacture, the patron may be considered as the customer (for instance, the patron is the customer). In such embodiments, the patron information 310b and the customer information 310a may overlap or include substantially the same information. In some embodiments in which the patron purchases directly from the memorial product manufacture, the patron may be affiliated with a customer (for example, may provide information as to an associated customer, including a funeral home or cemetery where the memorial product may be installed or otherwise handled). In such embodiments, the patron and the customer (for instance, cemetarian or funeral home), and information associated therewith, may be treated as separate entities although the patron is accessing the system as a customer.

The patron information 310b may include demographic information (for example, a name, an address, an age, deceased/living, a birth date, a death date, income information, a religion, a gender, education information, relationships, and/or the like), preferences, historical order information, and/or the like. Order information 310c may include information about present and/or past orders, including memorial product type, design elements, price, order date, delivery information, status, payment information, installation location, and/or the like.

Product information 310d may include any information about available memorial products that may be used by the design application to generate virtual memorial products. For instance, the product information 310d may include pricing information, dimensions, weight, materials, and available characteristics, such as finishes, borders, edges, design elements, coatings, colors, and restrictions. Certain memorial products may be associated with restrictions as the memorial products and/or characteristics thereof may not be available to all customers and/or in all locations. For instance, certain design elements may not be possible in combination with certain materials, finishes, coatings, and/ or the like. In another instance, certain memorial products, characteristics thereof and/or design elements may not be available to all customers, as described in more detail below.

As described above, the product information 310d may include pricing information, for example, prices associated with the product and any available design elements. In some embodiments, the design system 300 may include a customer pricing function configured to calculate a customer or retail price for the product, design elements, shipping, manufacturing costs, and/or any other cost associated with a product. For example, the customer pricing function may be configured to add a percentage of the cost from a supplier (for example, a "vendor price") to generate a retail price that may be used as the price for the product sold through the design system (for example, a "retail price"). For instance, a funeral services provider may purchase a product from a supplier for $100. The customer pricing function may multiply the vendor price by 1.10 to add a 10% increase to the price of the product that may be sold to a patron, such that the product will be priced to the patron at a $110 retail price. In some embodiments, the customer pricing function may be enabled/disabled based on a condition, such as the user account logged into the design system 300. As such, a customer may view actual prices when logged into a first account, on a first screen, or the like and may view the augmented prices when logged into a second account, on a second screen, or the like (for instance, when using the system with a patron).

The design elements information 310e may include information associated with the design elements available within the design system 300. The design elements information 310e may include data, images, storage objects (for example, electronic files) and/or the like. Non-limiting examples of design elements information 310e may include names, dimensions, characteristics (for example, available colors, materials, and/or the like), materials, physical characteristics, requirements, pricing information, affiliations (for example, whether the design element is affiliated with a civic organization, religion, region, or preference), and/or the like.

Design rule information 310f may include information associated with rules, restrictions, combinations, affiliations, relationships, and/or the like between various customers, patrons, memorial products, memorial product characteristics, design elements, and/or design element characteristics. For example, the design rule information 310f may indicate that there is an affiliation, preference, or the like between members of a certain civic organization and certain design elements. In another example, the design rule information 310f may include preference information, such as whether certain customers and/or patrons have a preference for certain memorial products, memorial product characteristics, design elements, and/or design element characteristics (the "design inventory"). In an embodiment, the design application may receive preference information directly, for instance, through a preference survey. In another embodiment, the design application may analyze available information within the design system 300, such as customer information 310a, patron information 310b, and/or order information 310f, and may automatically generate preferences. For example, the design application may analyze the customer information 310a and historical order information in the order information 310d to determine that a particular customer and/or customers with particular characteristics have a preference for a particular memorial product (for example, bronze plaques with images) or a particular layout and finish for certain memorial products. In another example, the design application may analyze the patron information 310b and historical order information in the order information 310d to determine that patrons from a certain sales region prefer a certain set of emblems, inscriptions, and/or the like. In this manner, the design application may "learn" customer and/or patron preferences from historical information in order to improve product suggestions generated using the design rule information 310f.

In an embodiment, the design application may be configured to provide access to all or substantially all of a design inventory to all customers. In another embodiment, the design application may be configured to restrict customers or particular customers from accessing portions of the design inventory. For example, certain items in the design inventory may be restricted by the owner of the particular design inventory element, due to intellectual property rights, non-compete agreements, competition concerns, and/or the like. For instance, a memorial product vendor may seek to sell certain portions of the design inventory to particular customers and certain other portions of the design inventory to a different set of customers. In another instance, certain of the design inventory may only be available to a customer or a portion of the customers in an effort by the memorial product vendor to provide exclusive, specialty product lines to customers, or the like. Accordingly, the design rule information 310f may include rules identifying particular customers that may access particular memorial products and/or design elements, as described in more detail below.

The foreign languages/symbols information 310g may include translations of text and/or equivalent symbols (for example, € in Europe for $ in United States) that may be commonly used by a customer and/or patron. In this manner, the design application may include a "translate" and/or "convert" GUI design object 215a-215c that may automatically translate text and/or convert a symbol to a foreign language or equivalent symbol.

As shown in FIG. 3, the design system 300 may include various modules 320a-320e configured to manage and execute certain functions for the design application. An automated design module 320a may be configured to generate virtual memorial products based on user input 330 to the design system 300 and/or the system information 310a-310f. The design application may include a user interface (see FIG. 4) for receiving information associated with the subject of the memorial product, such as the deceased for a funeral marker, an honoree for a commemorative plaque, an educational institution for a campus sign, user and/or subject preferences, and/or the like. Subject information may include information specific to the subject and/or preferences of the subject of the memorial product (for example, see FIG. 4). For instance, the subject may include a deceased that is the focus of a grave marker or other memorial product. In another instance, a subject may include an organization or other entity that is the focus of a sign or plaque. Non-limiting examples of subject information may include name, age, gender, religion, nationality, native language, marital status, familial relationships (for example, whether the subject is a father, grandfather, brother, husband, and/or the like), organizational affiliations (for example, clubs, activities, civic organizations, public organizations or offices), vocation, education, and/or any other information useful for designing a memorial product.

The subject information may be analyzed by the automated design module 320a, for example, using the design rule information 310f, to generate one or more pre-configured virtual memorial products. The automated design module 320a may analyze the subject information in combination with portions of the system information 310a-310f to generate the pre-configured virtual memorial products. The pre-configured virtual memorial products generated by the automated design module 320a may include portions of the design inventory suggested by the automated design module 320a as being likely to be of interest to the customer and/or patron based on the subject information, the design rule information 310f and/or the other portions of the system information 310a-310e and 310g.

For example, the automated design module 320a may generate a pre-configured virtual memorial product for a funeral marker product that includes a textured bronze surface, an embedded vase element, the name and birth/death dates of the deceased, and a set of religious symbols selected based on the subject information and the customer information 310a. In this example, the subject information may have indicated the religion of the deceased and the customer information 310a may have indicated the type of memorial product frequently chosen by patrons of the customer.

In this manner, the design application may be configured to provide design inventory configurations that are likely to be of interest to customers and/or patrons. The design inventory configurations generated by the design application according to some embodiments described herein may more accurately reflect the needs and preferences of customers and/or patrons because, among other things, they are based on information supplied directly by the customer and/or patron and/or by historical information of past orders that are relevant to the customer and/or patron. As such, the design application may provide a product selection and design process that is easier, more efficient, and provides an enhanced user experience.

The graphics module 320b may be configured to generate realistic, three-dimensional graphical ("virtual") representations of physical objects and the spatial relationships of physical objects based on information included in the product information 310d and/or design elements 310e information sources. In some embodiments, the graphics module 320b may provide functions for a user (for instance, a design system 300 operator) to create virtual representations or templates through a template design function or application. For instance, a user may be presented with various template elements, such as shapes, patterns, colors, or the like. The user may use the template elements to design (or "draw") a template that may be used within the system. For example, the user may design virtual representations that correspond with certain products that may be accessed by customers through the design system 300.

In some embodiments, the design system 300 may access product information 310d from third-party sources and/or internal data sources (e.g., enterprise and/or business analytics software, including, without limitation, SAP®, Websphere®, or the like). The product information 310d may include data about a particular product, such as dimensions, model numbers, materials, or the like. The graphics module 320b may be configured to analyze the product information 310d and generate a virtual representation of the physical product being referred to by the product information 310d. For example, the product information 310d for a particular product may indicate that the product is a gravestone, having specific height, width, and depth dimensions and is made from a particular granite material. The graphics module 320b may be configured to analyze this information and to automatically generate a corresponding virtual representation of the gravestone. The virtual representation may be saved and associated with the physical gravestone product. A user may view and edit the virtual representation. In this manner, the design system 300 may generate a virtual representation for each product accessible by the design system 300 without requiring a user to create the virtual representation. As such, if a new product is input into a product database, the design system 300 may automatically generate a virtual representation (i.e., template) of the product without user intervention. The template may be stored in one or more databases for future use and/or editing.

The order management module 320c may be configured to handle the ordering process within the design application, including processing ordering and payment information. For example, when a customer submits an order, the order management module 320c may perform certain processes to ensure that the order is correct and complete and to transmit the order to the correct destination for the production of the physical memorial product.

The product file generation module 320d may be configured to manage the creation of storage objects in the form of electronic ("digital") files for the virtual memorial products.

For example, the product file generation module 320d may be configured to save the virtual memorial products in various formats required by the customer and/or manufacture including, without limitation, XML files, image files (for instance, *.bmp, * jpeg, *.tiff, *.gif, *.png, and/or the like), Microsoft Visio® files (*.vsd), the Corel® family of software products, the Adobe® family of software products, portable document format files, legacy file formats, backward compatible file formats, or any other file type now known or developed in the future. The product file generation module 320d may be configurable to create storage objects in particular formats, such as proprietary formats, required by certain customers and/or patrons. The reporting module 320e may be configured to generate various reports for customers, patrons and/or the memorial product vendor related to memorial products and/or orders. For example, a user may generate a report for one or more orders that includes information such as price, shipping information, order status, memorial product type, selected portions of the design inventory, and/or the like.

As depicted in FIG. 3, the design system 300 may be configured to generate a virtual memorial product 340 (or, a storage object including information associated with the virtual memorial product) based on user input 330, including subject information and design inventory choices selections and customizations, and system information 310a-310f in combination with the operation of various modules 320a-320e. For example, the user may select a "submit" button to finalize the project and to begin the ordering process. The design system 300 may generate a final virtual memorial product 340 responsive to selection of "submit." Embodiments are not limited to the specific configuration of modules 320a-320e depicted in FIG. 3, as these are provided for illustrative purposes only. For example, the design application may include more or fewer modules 320a-320e and/or the modules may be combined to form other modules or as programs, subroutines, or the like of other modules.

The virtual design product 340 may be used by the customer and/or a manufacturer for various purposes, such as for printing or to produce a physical memorial product based on the virtual memorial product. A manufacturer may receive the virtual design product 340 in one or more formats required for their particular production process. For instance, the manufacture may manually produce portions of the memorial product, such as through manual typesetting of text, carving, affixing design elements, etching, cutting, or the like. The manufacturer may print (a copy of) the virtual memorial product 340, project an image produced based on the virtual design product onto the physical material that will be used to create the virtual memorial product, and/or provide the virtual design product to a computing device configured to automatically generate the physical memorial product or portions thereof from the physical material.

Figure 4:
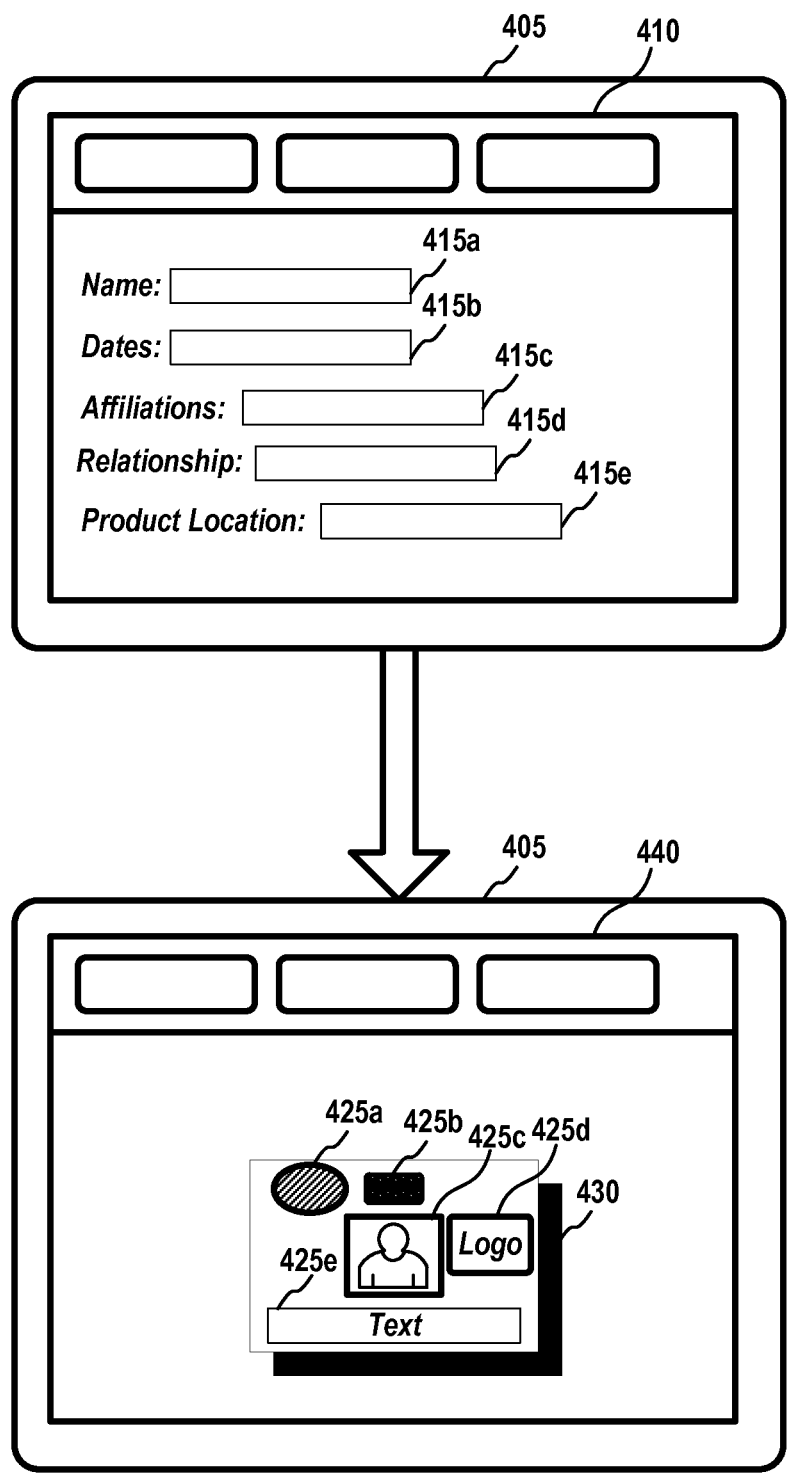
FIG. 4 depicts an illustrative subject information interface and a pre-configured virtual memorial product according to an embodiment.

FIG. 4 depicts an illustrative subject information interface and a pre-configured virtual memorial product according to an embodiment. As shown in FIG. 4, a display component 405 may present a subject information interface 410 configured to accept subject information 415a-415e for the order. For example, the subject information 415a-415e may be associated with the customer or a patron of the customer this is the subject of the memorial product or is otherwise affiliated with the subject of the memorial product. For example, the order may be for a funeral marker for a deceased individual and the subject information 415a-415e may be received from a relative of the deceased. In another example, the order may be for a sign for an educational institution, and the subject information 415a-415e may be received from an employee of the educational institution. In a further example, the order may be for a commemorative plaque for a business entity, and the subject information 415a-415e may be received from an employee of the business entity.

The subject information 415a-415e may include information concerning various aspects of the subject, such as names 415a, dates 415b, affiliations 415c, relationships 415d, and/or the product location 415e associated with the subject. The design application may use the subject information 415a-415e to present a memorial product interface 440 that includes a pre-configured virtual memorial product 430 (or multiple pre-configured virtual memorial products). The virtual memorial product 430 may have been pre-configured, for example, by the automated design 320a module. The pre-configured virtual memorial product 430 may be selected and may include certain design elements 425a-425e selected based on the subject information 415a-415e. According to some embodiments, the pre-configured virtual memorial product 430 may be generated based on the system information 310a-310f in addition to or in alternative to the subject information 415a-415e.

Figure 5:
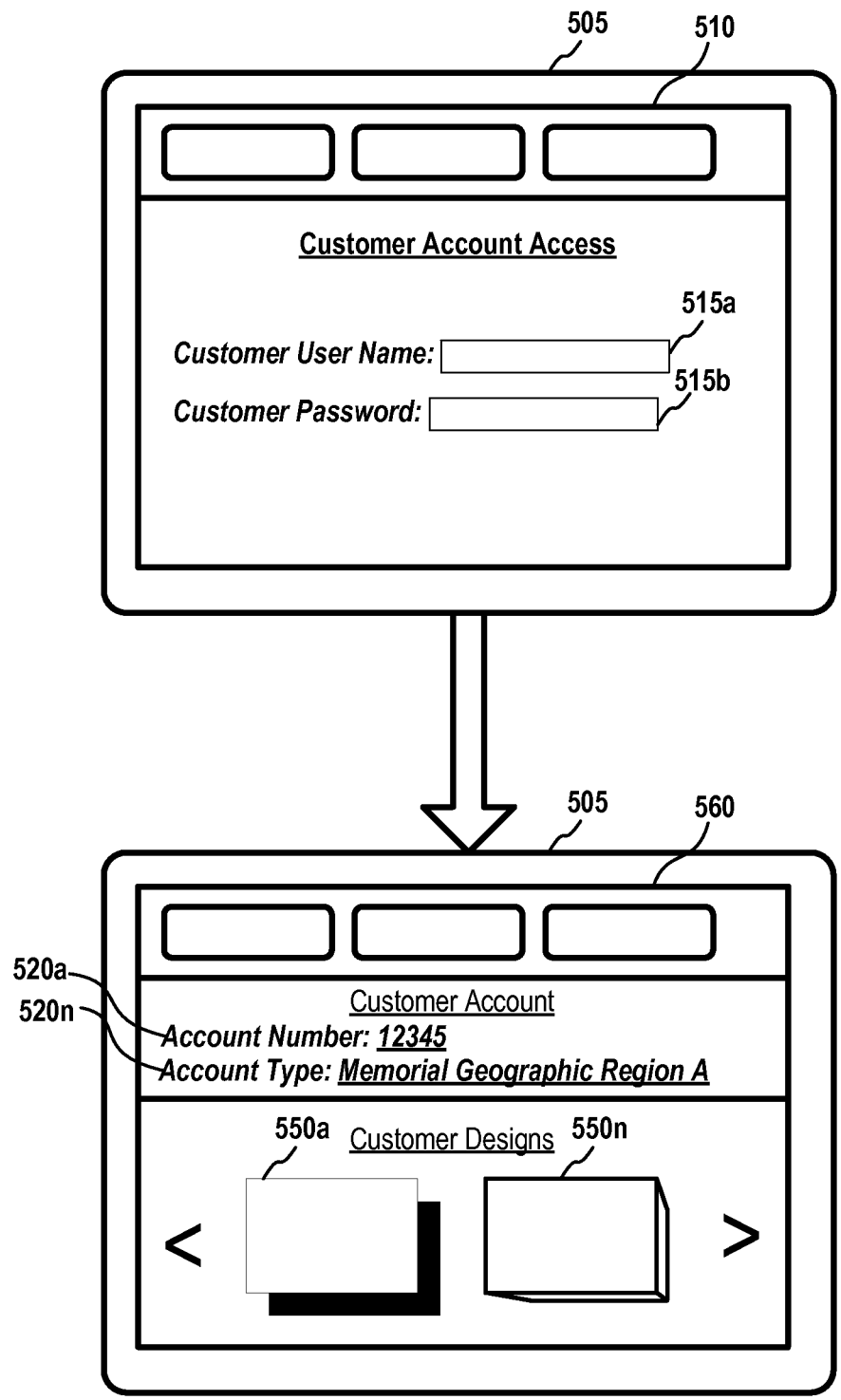
FIG. 5 depicts a customer account access interface and a customer account interface according to an embodiment.

FIG. 5 depicts a customer account access interface and a customer account interface according to an embodiment. As shown in FIG. 5, the design application may present a customer access interface 510 to a user on a display component 505. The user may enter customer account information, such as a user name 515a and a password 515b to access portions of the design application associated with the customer account. For example, the manufacturer or customer may be able to access information limited to viewing by the customer or patron, such as previous order information. In an embodiment, customers may only be able to design and/or order products through the customer account. In this manner, the memorial product vendor may be able to manage customer design and order access and/or choices. The design application may present a customer account interface 560 responsive to a successful login to the user account from the customer access interface 510. In some embodiments, the design application may be configured to provide various customer support features, including, without limitation, through the customer access interface 510 and/or the customer account interface 560. In some embodiments, the customer support features may include, but are not limited to, real-time chat and screen-takeover functions.

The customer account interface 560 may provide access to the customer to their customer information 520a-520n and customer designs 550a-550n (for instance, suggested memorial products and/or design elements, portions of the design inventory, or the like) that the customer is allowed to use to generate virtual memorial products. In this manner, the design application may provide a customer with a "virtual showroom" through which they and/or their patrons may view available portions of the design inventory. In some embodiments, the "virtual showroom" (or any user interface provided according to some embodiments) may be configured to provide various files, visualizations, multimedia files and/or presentations, representations, pictures, images, or the like. For example, the "virtual showroom" (or any user interface provided according to some embodiments) may be configured to allow users to access multimedia presentations (for example, audio/video presentations), including multimedia presentations relating to the design system 100 and/or any information or products associated therewith.

Figure 6:
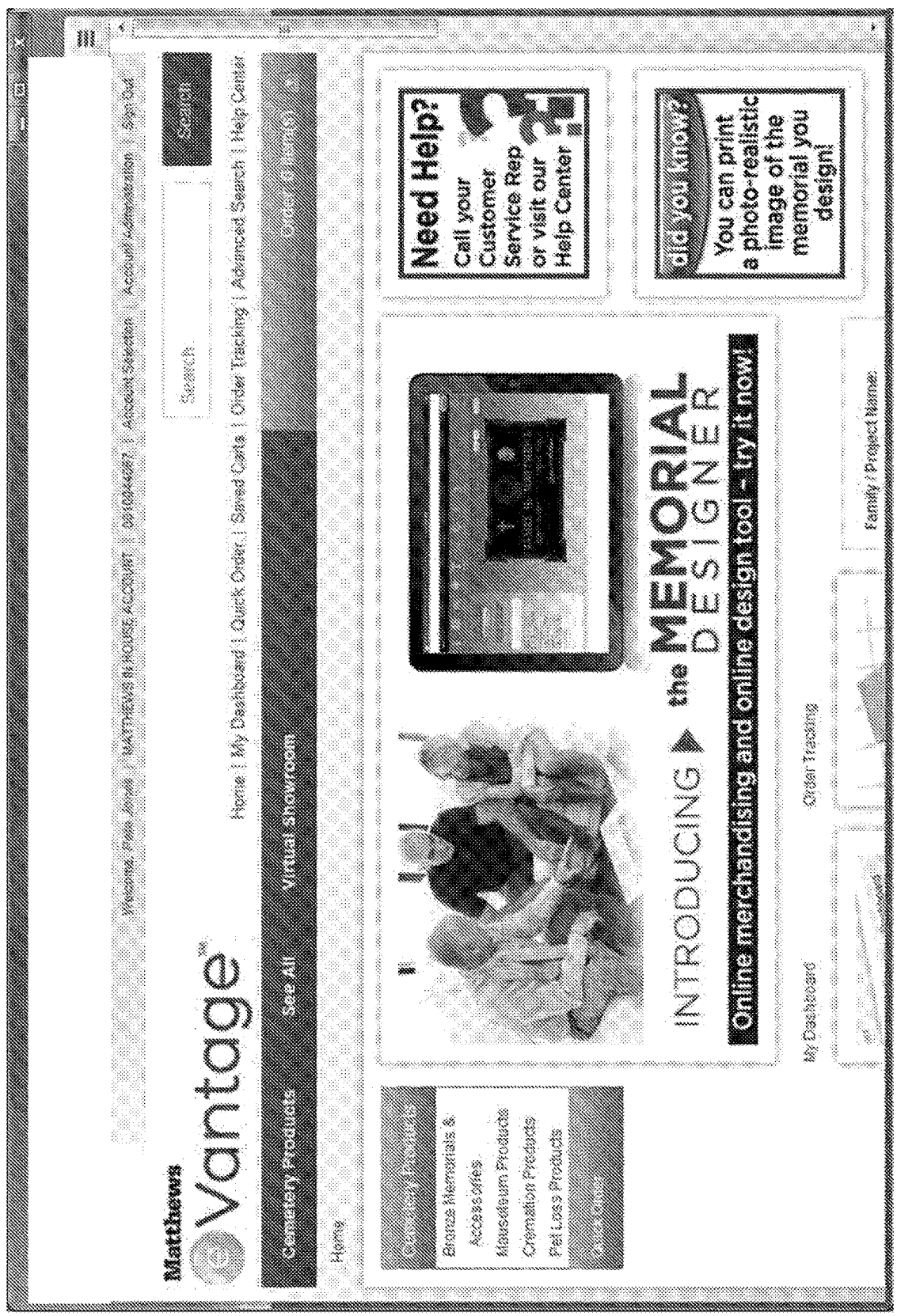
Figure 7:
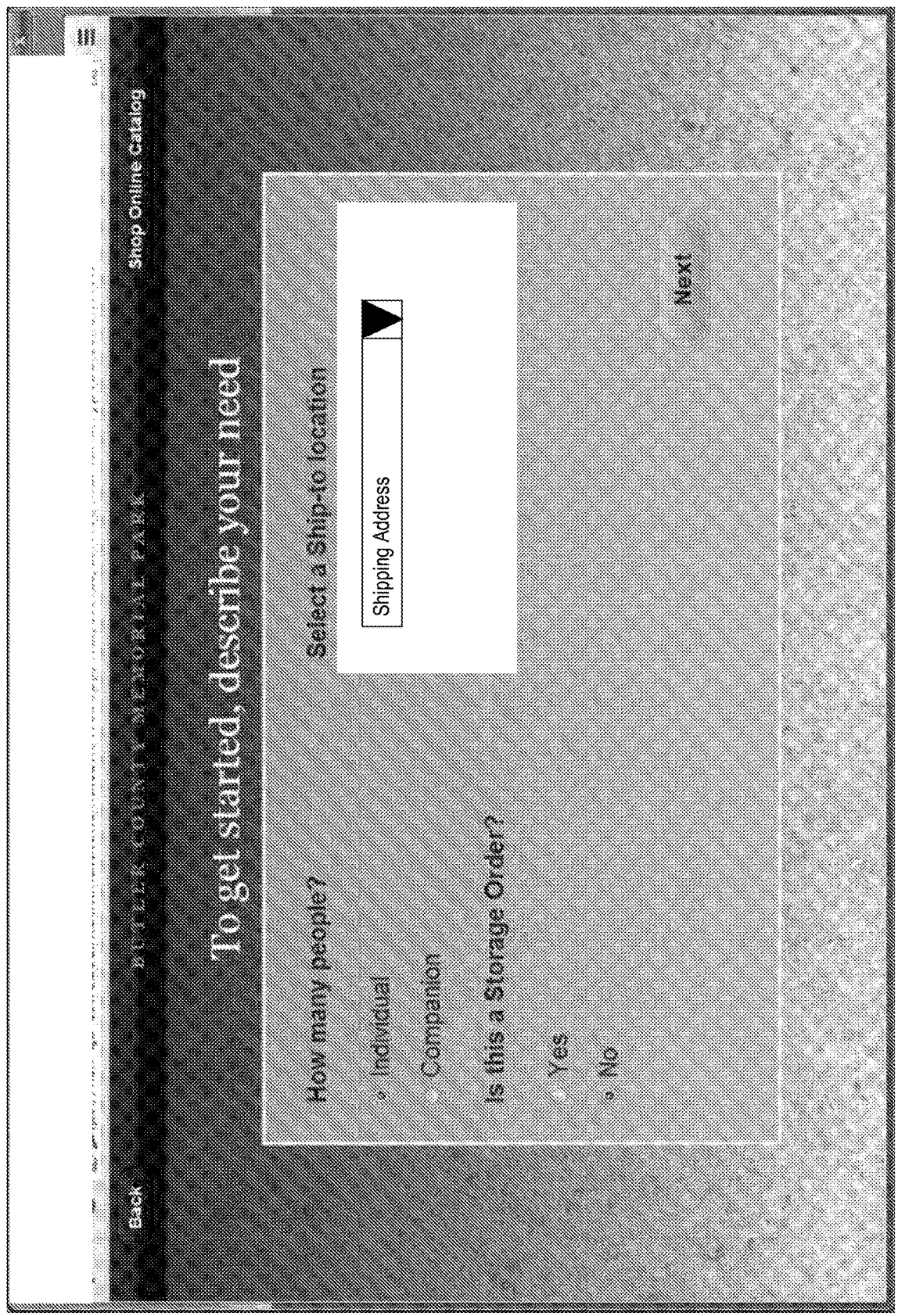
Figure 9:
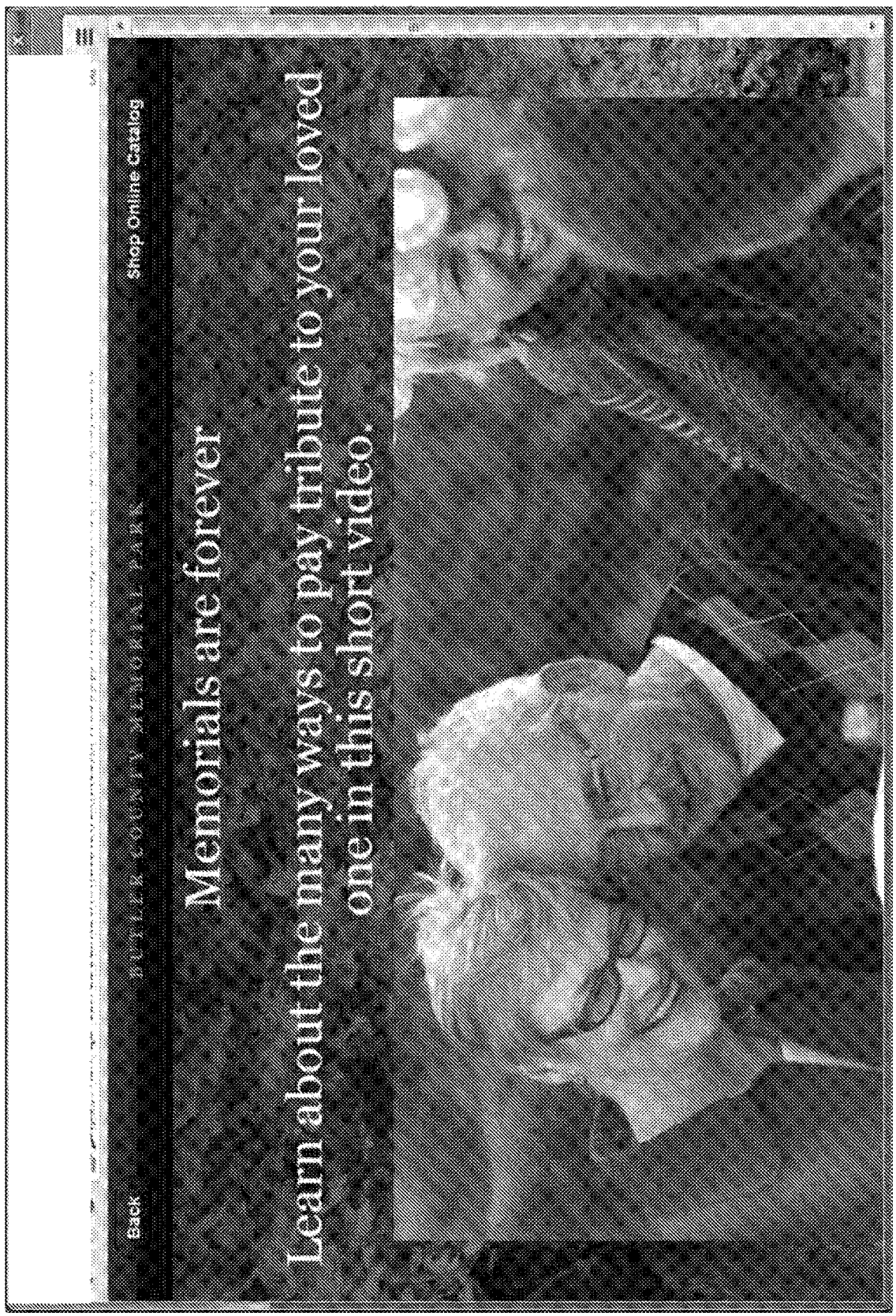
Figure 10:
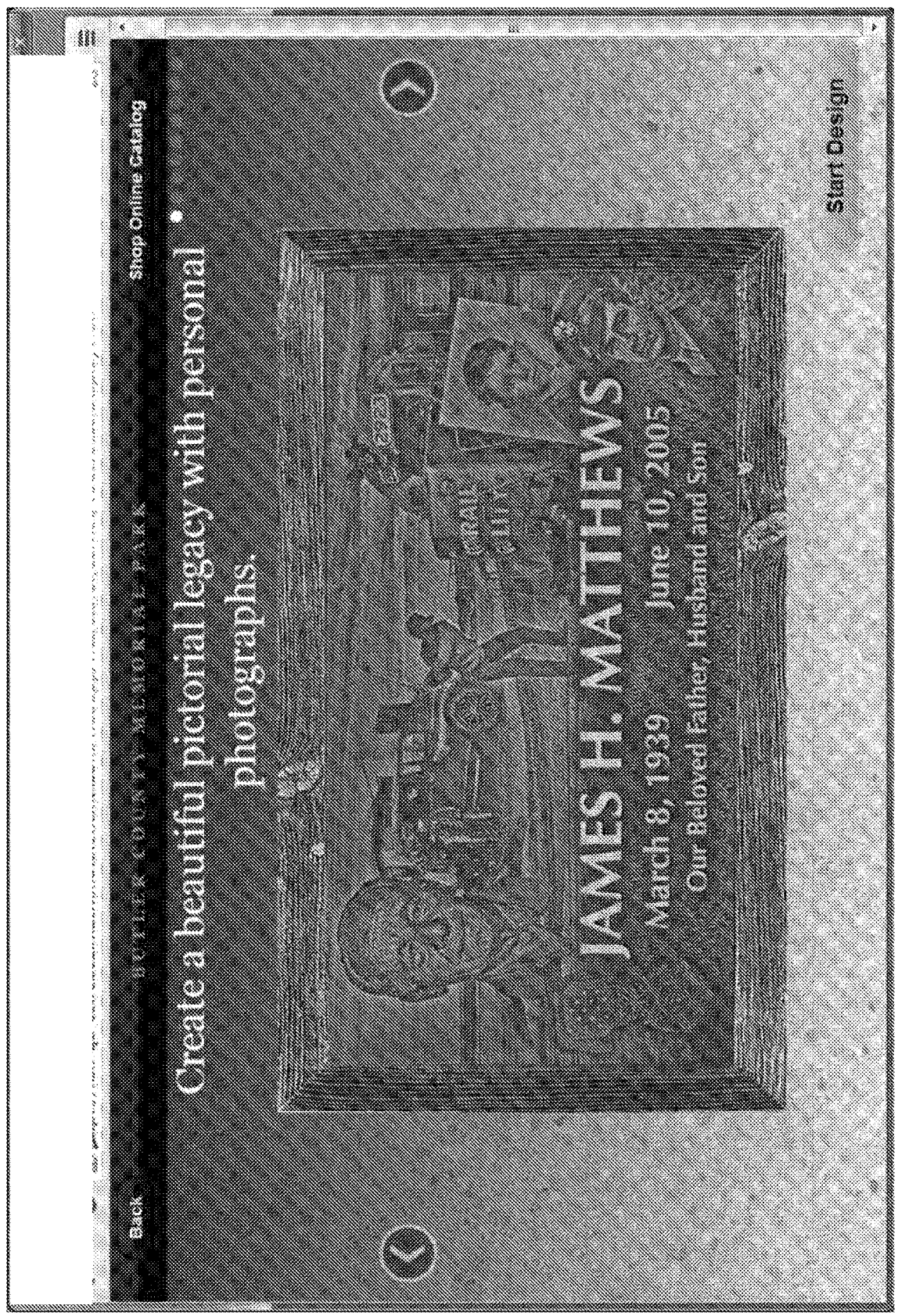
Figure 11:
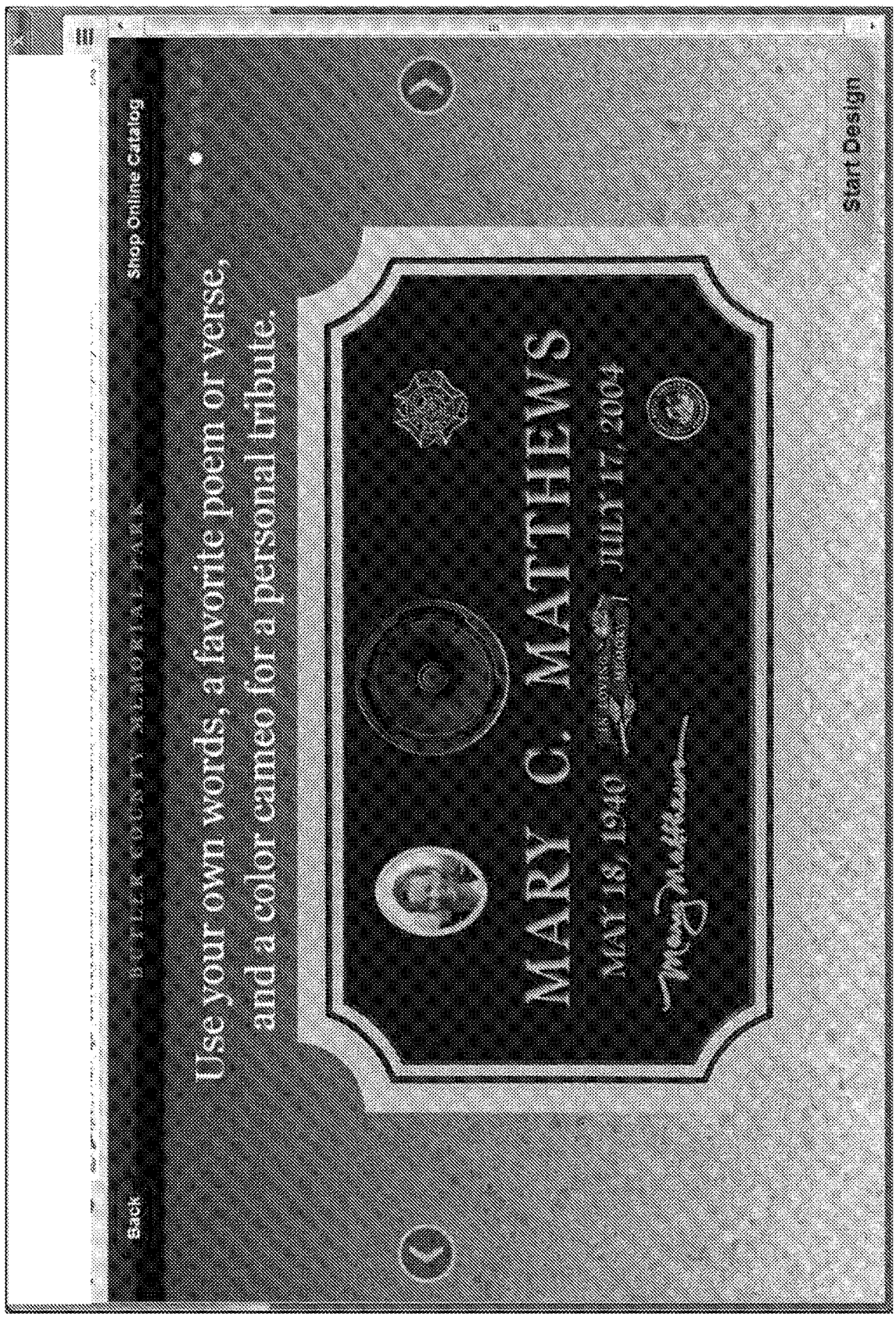
Figure 12:
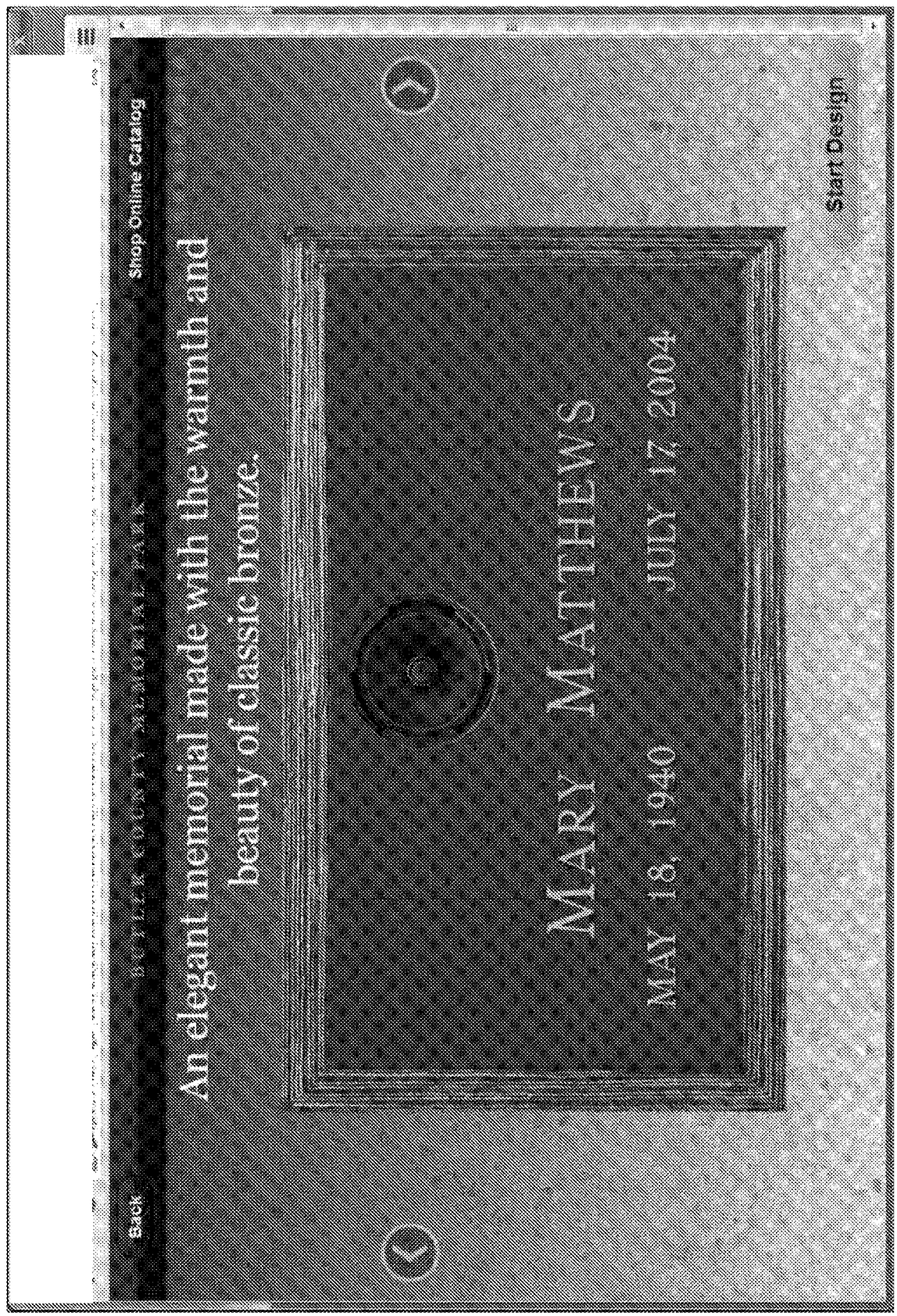
Figure 13:
Figure 14:
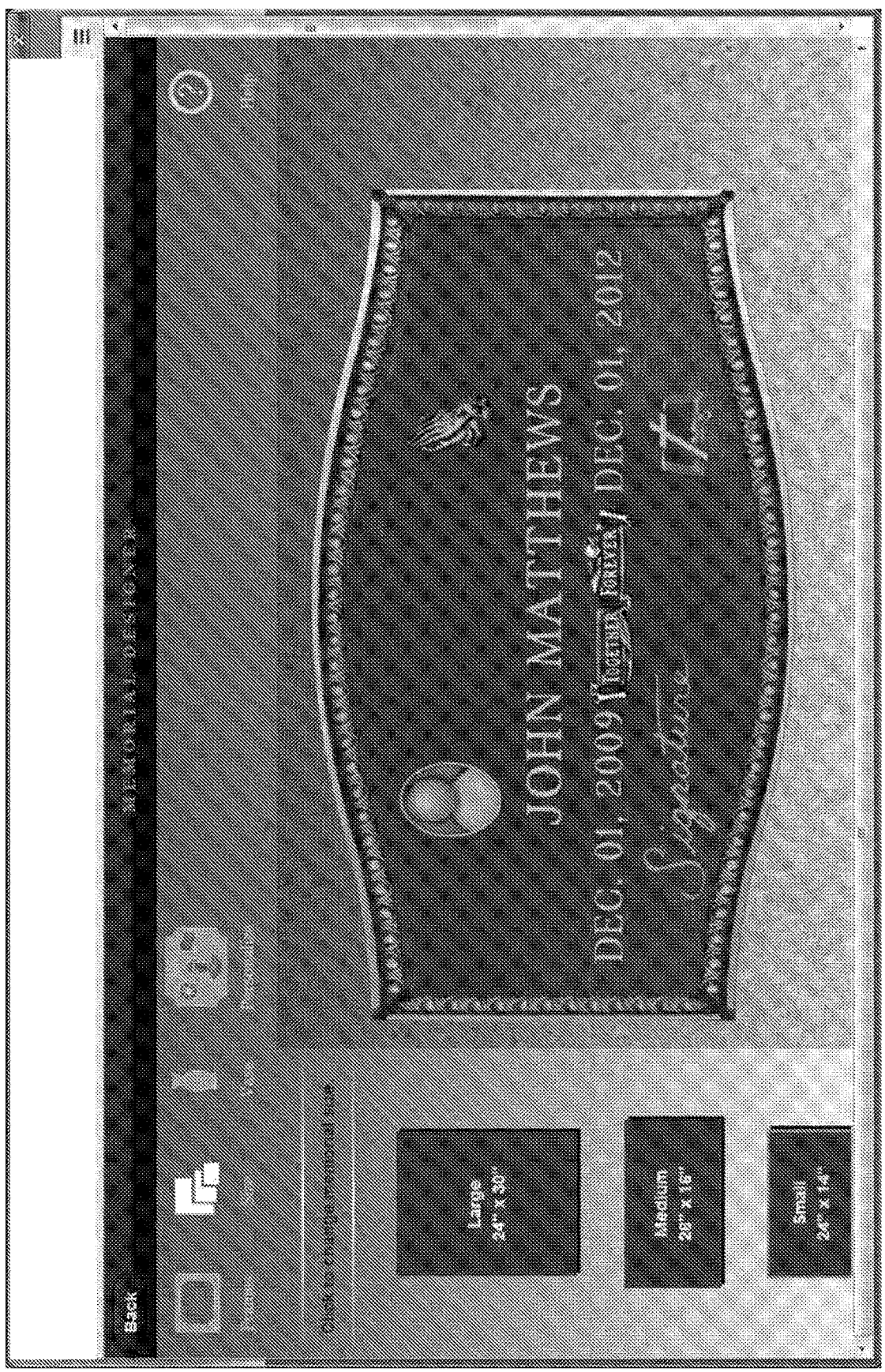
Figure 15:
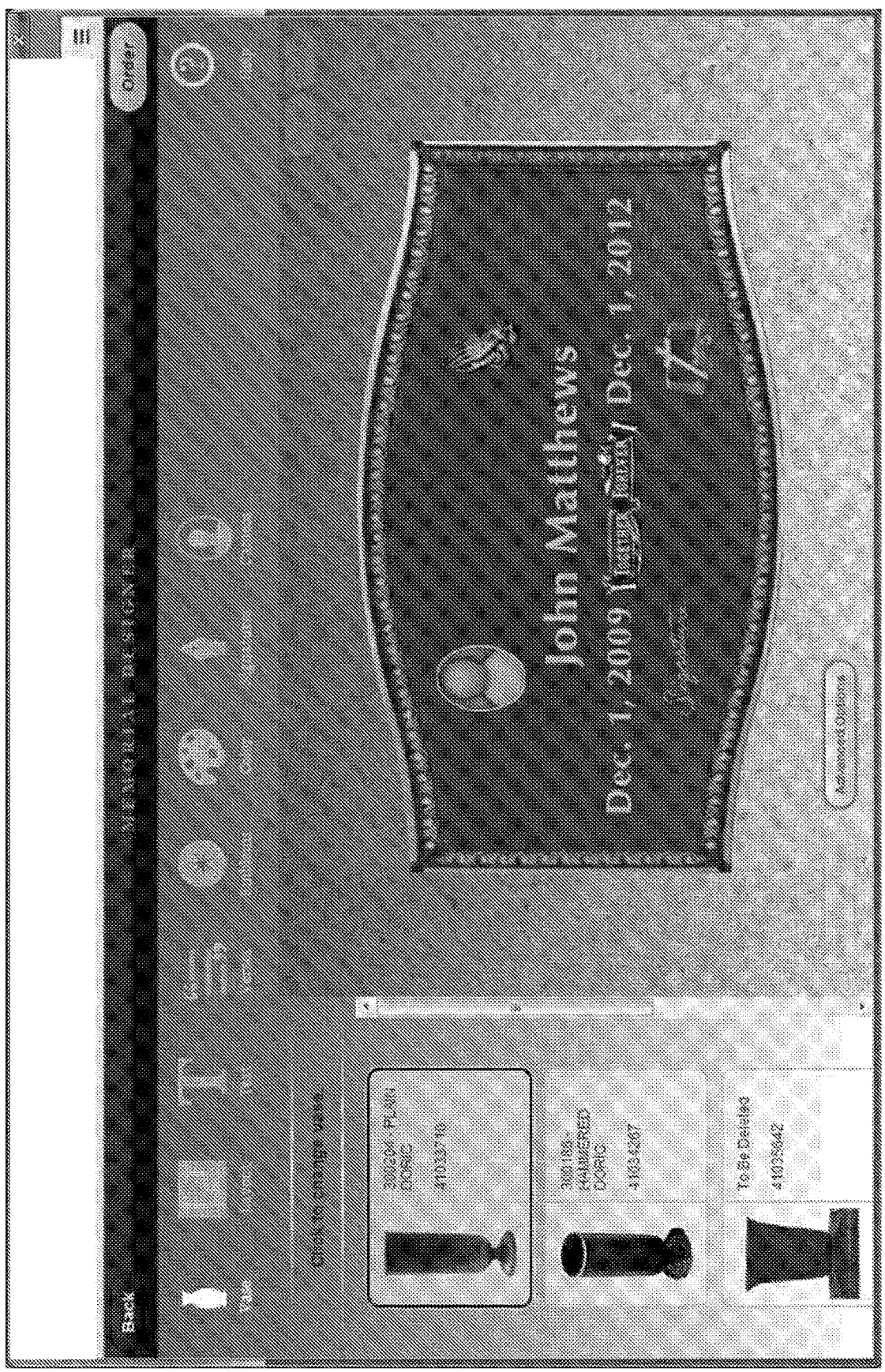
Figure 16:
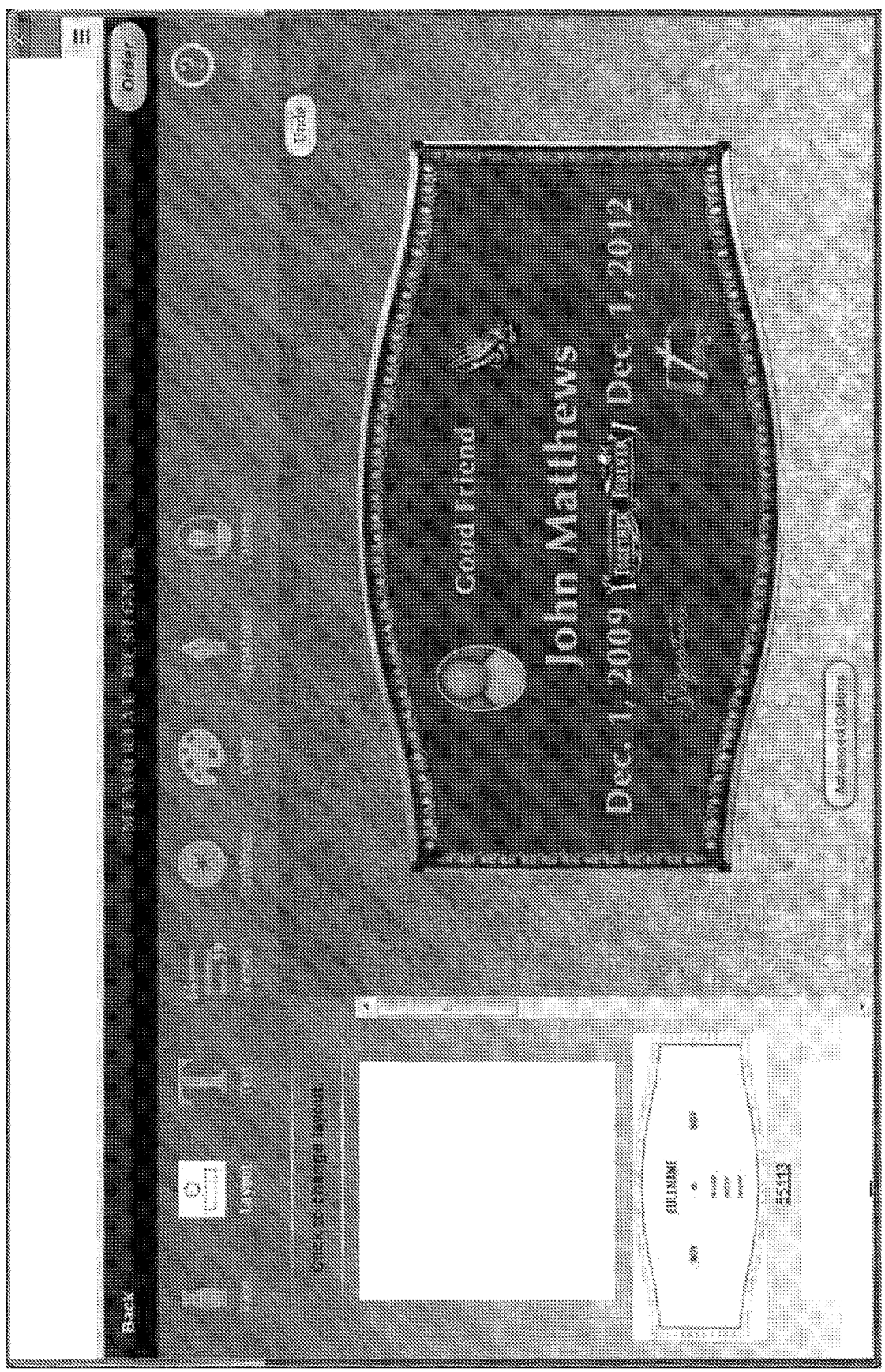
Figure 17:
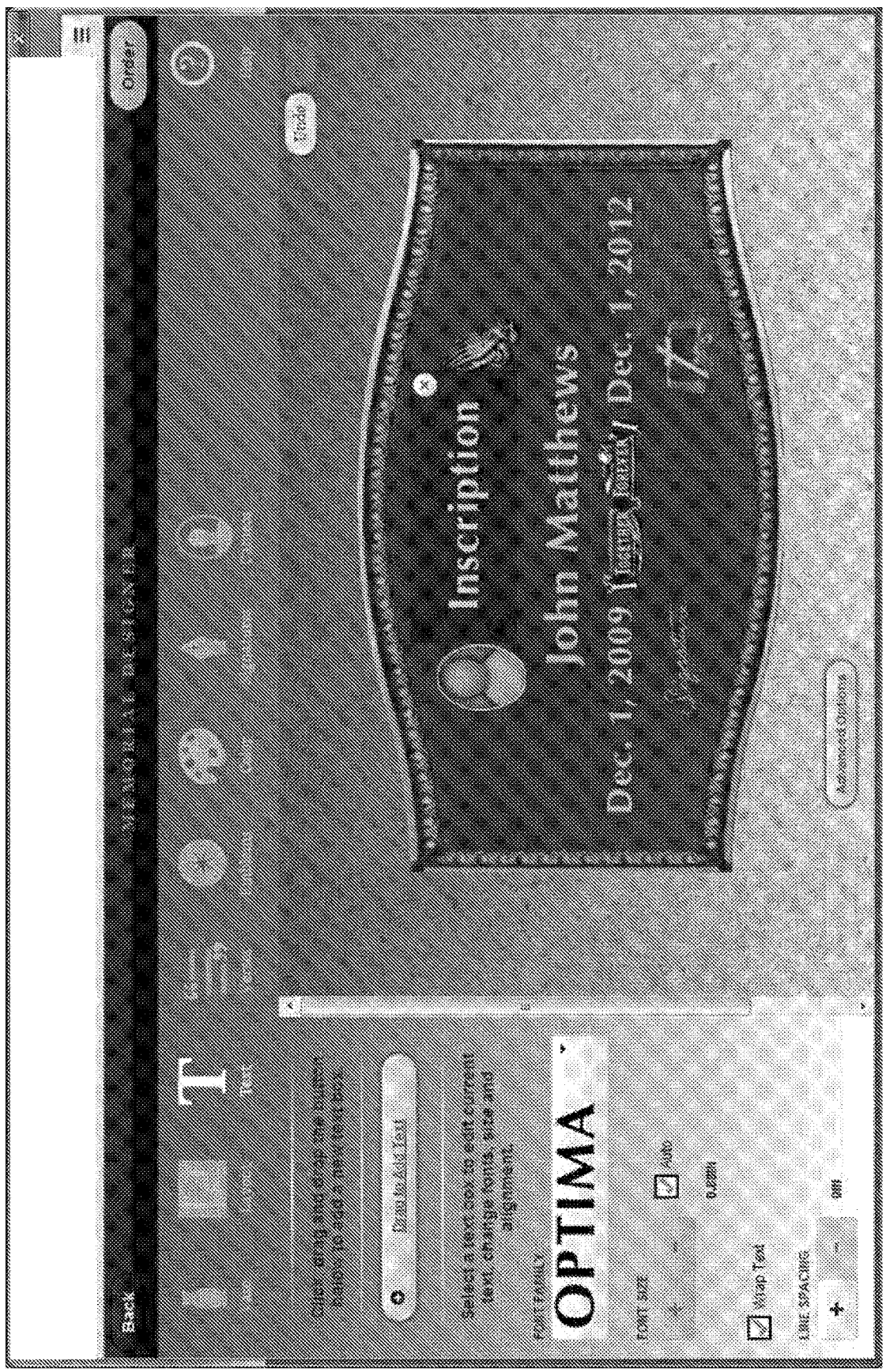
Figure 18:
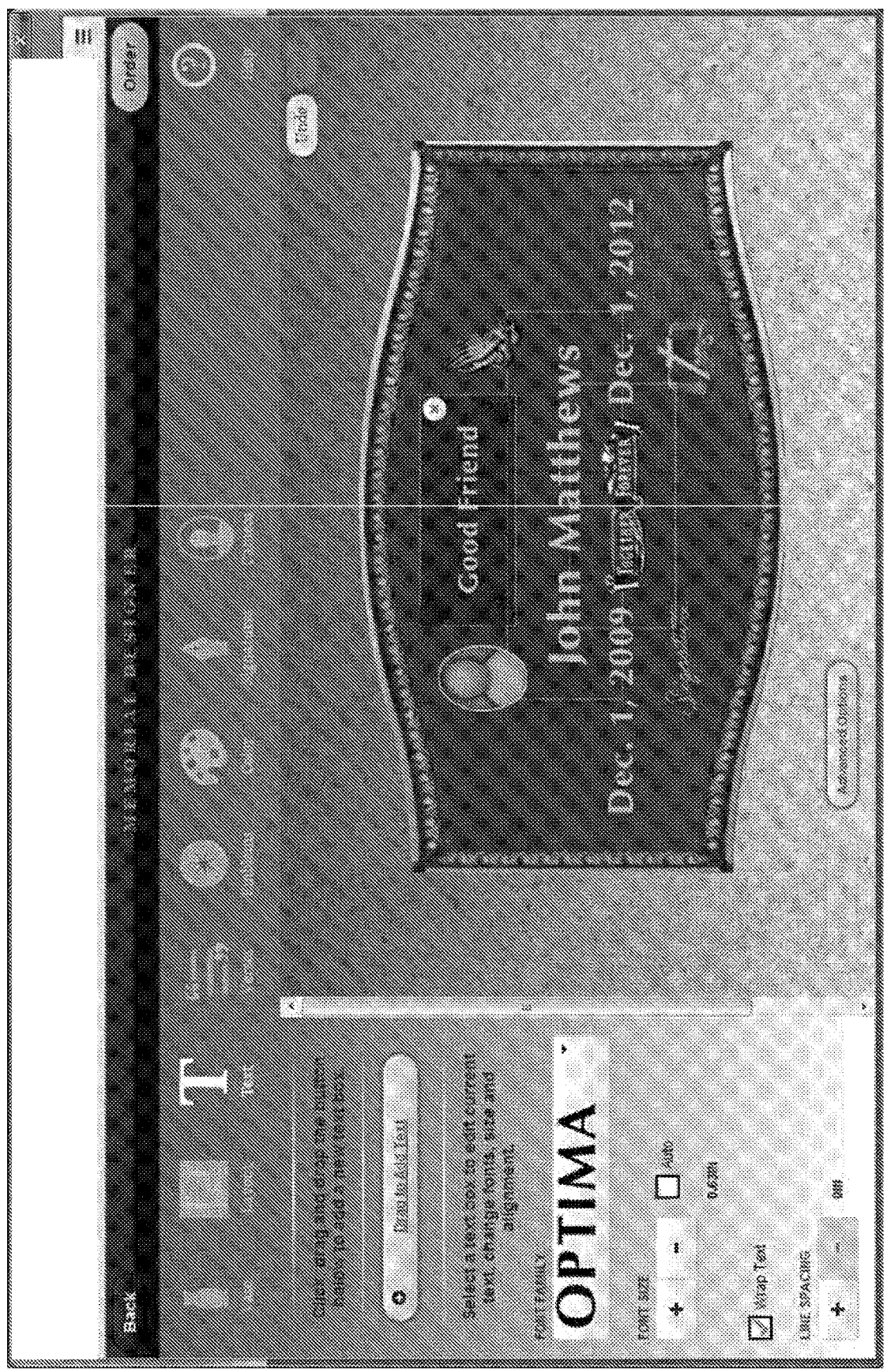
Figure 19:
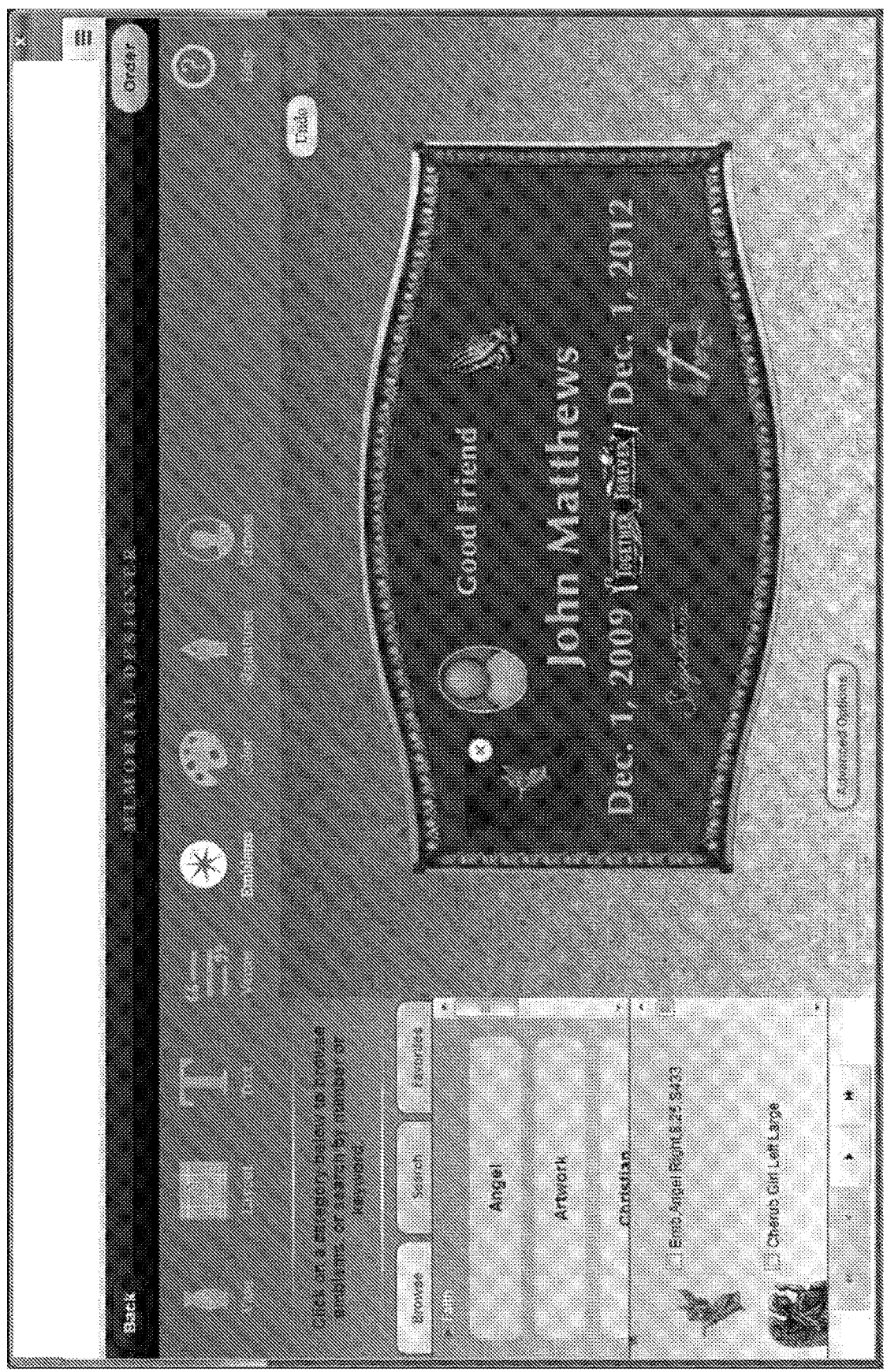
Figure 20:
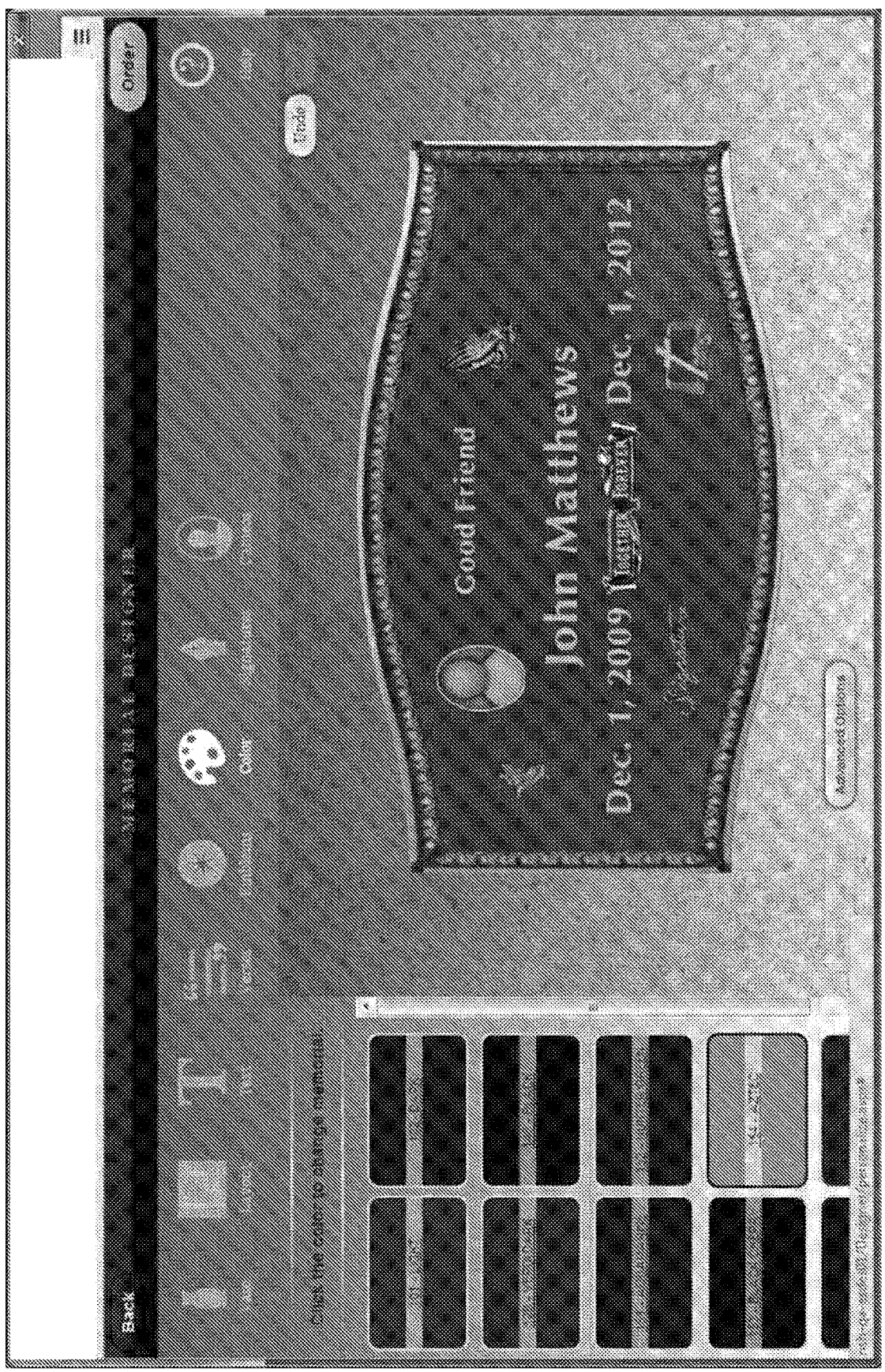
Figure 21:
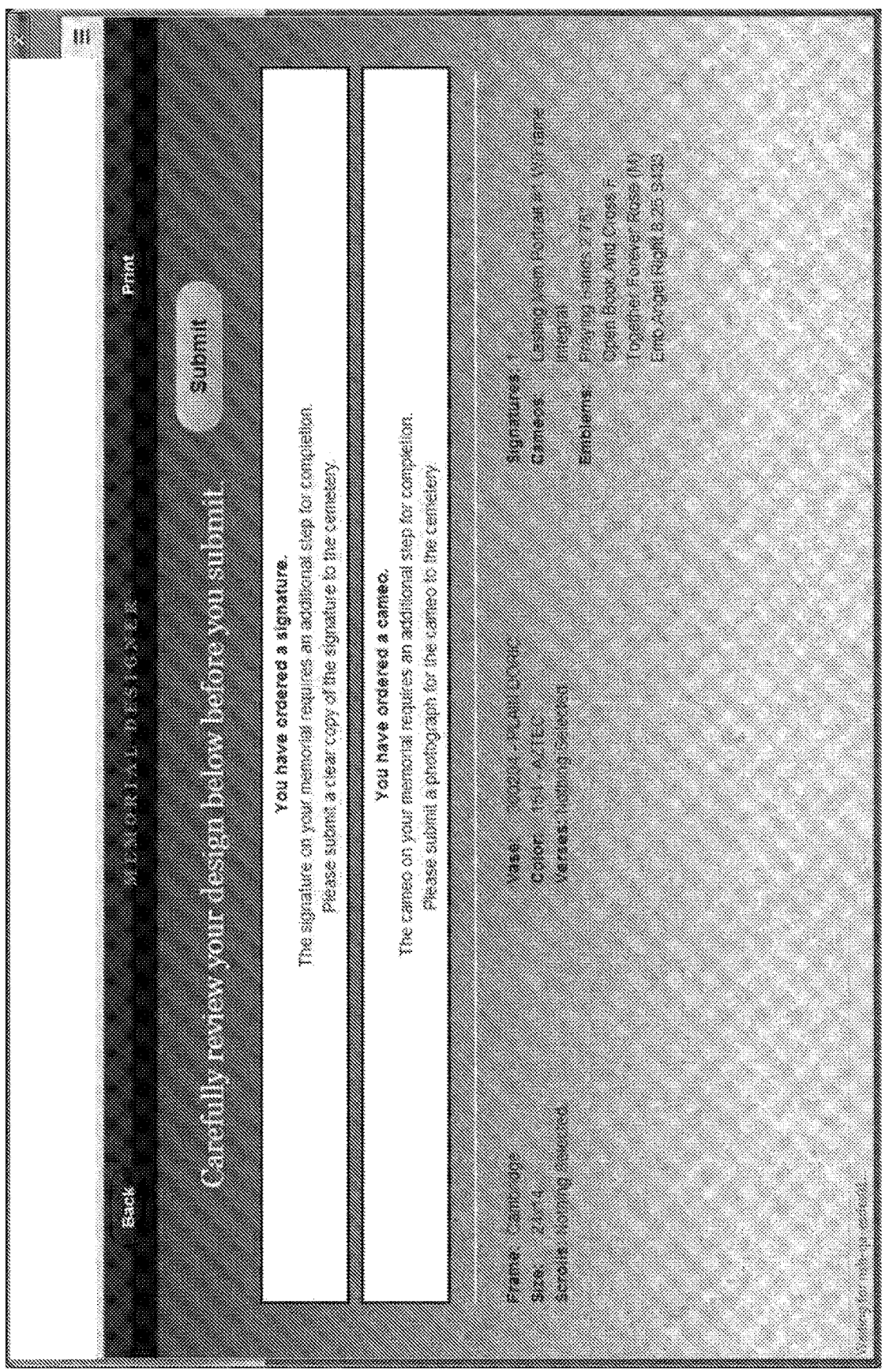
Figure 22:
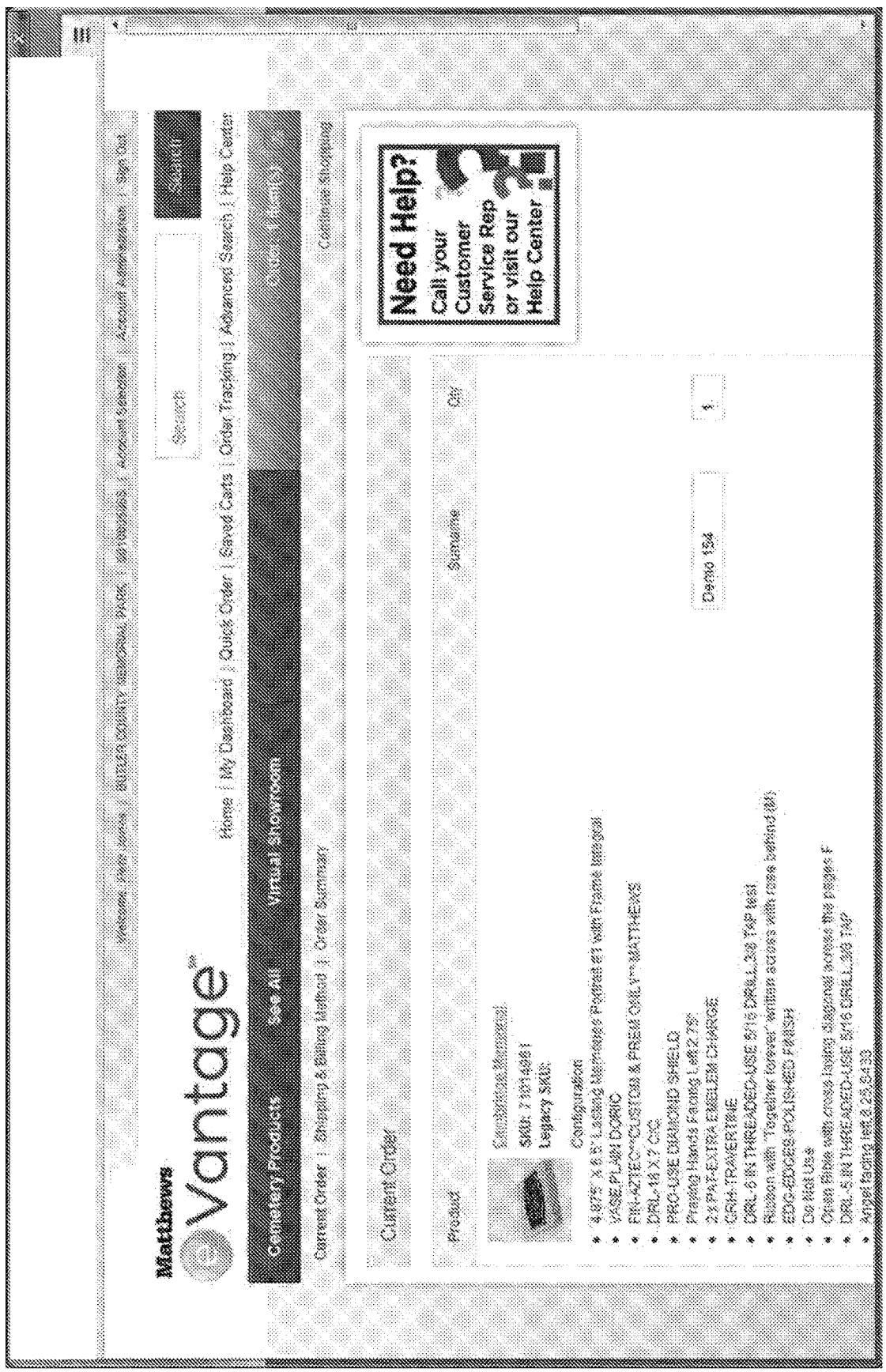

FIGS. 6-22 depict various illustrative user interfaces for a design system according to some embodiments. For example, FIG. 6 depicts a startup interface for the design system from which a user, for example, may login to a customer account, view memorial products, or the like. FIG. 7 depicts an interface for entering order information, and FIG. 8 depicts an interface for entering subject information. FIG. 9 depicts a video interface in which various videos may be presented to customers and/or patrons regarding the process for designing memorial products using the design system. FIGS. 10-12 depict various types of memorial products. FIGS. 13-20 depict various interfaces for selecting, manipulating, and/or editing various design inventory elements. FIG. 21 depicts an order submission interface, and FIG. 22 depicts an order information interface for a completed order.

Figure 23:
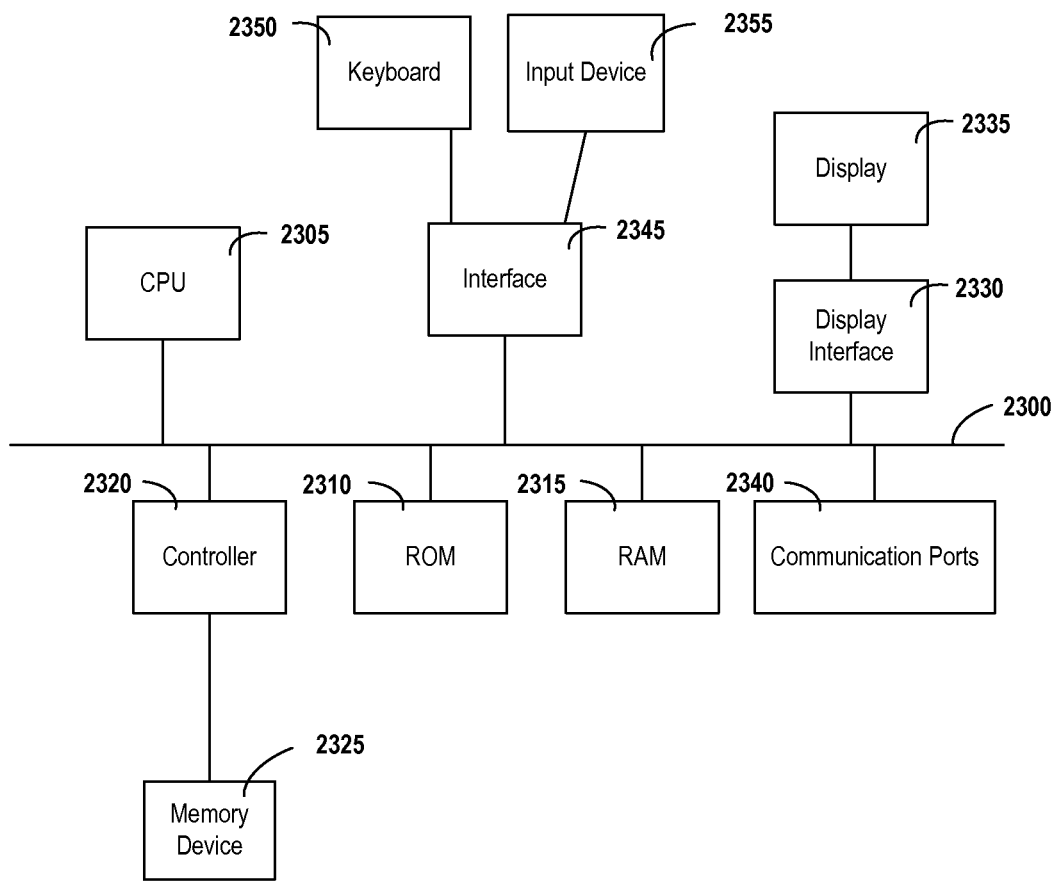
FIG. 23 illustrates various embodiments of a computing device for implementing the various methods and processes described herein.

FIG. 23 depicts a block diagram of exemplary internal hardware that may be used to contain or implement the various computer processes and systems as discussed above. A bus 2300 serves as the main information highway interconnecting the other illustrated components of the hardware. CPU 2305 is the central processing unit of the system, performing calculations and logic operations required to execute a program. CPU 2305, alone or in conjunction with one or more of the other elements disclosed in FIG. 23, is an exemplary processing device, computing device or processor as such terms are used within this disclosure. Read only memory (ROM) 2330 and random access memory (RAM) 2335 constitute exemplary memory devices.

A controller 2320 interfaces with one or more optional memory devices 2325 to the system bus 2300. These memory devices 2325 may include, for example, an external or internal DVD drive, a CD ROM drive, a hard drive, flash memory, a USB drive and/or the like. As indicated previously, these various drives and controllers are optional devices. Additionally, the memory devices 2325 may be configured to include individual files for storing any software modules or instructions, auxiliary data, common files for storing groups of results or auxiliary, or one or more databases for storing the result information, auxiliary data, and related information as discussed above.

Program instructions, software or interactive modules for performing any of the functional steps associated with the analysis of judicial decision making as described above may be stored in the ROM 2330 and/or the RAM 2335. Optionally, the program instructions may be stored on a tangible computer-readable medium such as a compact disk, a digital disk, flash memory, a memory card, a USB drive, an optical disc storage medium, such as a Blu-ray™ disc, and/or other recording medium.

An optional display interface 2330 may permit information from the bus 2300 to be displayed on the display 2335 in audio, visual, graphic or alphanumeric format. The information may include information related to a current job ticket and associated tasks. Communication with external devices may occur using various communication ports 2340. An exemplary communication port 2340 may be attached to a communications network, such as the Internet or a local area network.

The hardware may also include an interface 2345 which allows for receipt of data from input devices such as a keyboard 2350 or other input device 2355 such as a mouse, a joystick, a touch screen, a remote control, a pointing device, a video input device and/or an audio input device.

It will be appreciated that various of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art which alternatives, variations and improvements are also intended to be encompassed by the following claims.

What is claimed is:

1. A system for generating a virtual memorial product, the system comprising:
a processor;
a display device, wherein the display device comprises a web-based interface; and
a non-transitory, computer-readable storage medium in operable communication with the processor, wherein the computer-readable storage medium contains one or more programming instructions that, when executed, cause the processor to:
receive, via the web-based interface, subject information and customer information,
receive, via the web-based interface, one or more design elements and one or more memorial product characteristics associated with a three-dimensional memorial product, wherein the three-dimensional memorial product comprises at least one of a grave marker, a headstone, an urn, a vase, a plaque, a medal, a trophy, a sculpture, a statue, a scroll, granite, a niche plate, a crypt plate, crypt text, emblems, or a casket,
restrict a combination of the one or more design elements and the one or more memorial product characteristics based on design rule information,
generate at least one virtual three-dimensional memorial product, using at least one design function, based on the one or more memorial product characteristics, the at least one virtual three-dimensional memorial product comprising at least one memorial product template and at least one virtual design element selected based on the subject information and the customer information, wherein at least one virtual design function comprises a collision detection design function configured to detect whether a threshold distance exists between the one or more design elements and to detect whether each of the one or more design elements is affixed to a portion of the least one virtual three-dimensional memorial product,
display, on the web-based interface, the at least one virtual three-dimensional memorial product, and
generate an order for a physical three-dimensional memorial product based on the at least one virtual three-dimensional memorial product, wherein the at least one virtual three-dimensional memorial product is usable by a computing device to automatically print or produce at least part of the physical three-dimensional memorial product.

2. The system of claim 1, wherein the at least one virtual three-dimensional memorial product comprises at least one of a grave marker, a headstone, an urn, a vase, a plaque, a medal, a trophy, an award, a sculpture, a statue, a sign, a picture, a display, and a combination thereof.

3. The system of claim 1, wherein the at least one virtual three-dimensional memorial product comprises a cast bronze memorial product.

4. The system of claim 3, wherein the cast bronze memorial product comprises a cast bronze plaque.

5. The system of claim 1, wherein the at least one virtual design element further comprises at least one of an image, an emblem, a logo, a symbol, a religious symbol, a symbol of affiliation, a signature, a pattern, a design, a color, a texture, and a computer-readable element.

6. The system of claim 1, wherein the subject information comprises at least one of name, age, gender, religion, nationality, native language, marital status, familial relationships, organizational affiliations, vocation, and education.

7. The system of claim 1, wherein the customer information comprises information associated with a cemetery operator.

8. The system of claim 7, wherein the at least one virtual three-dimensional memorial product is selected based on the cemetery operator.

9. The system of claim 7, wherein the at least one virtual design element is selected based on the cemetery operator.

10. The system of claim 9, wherein the at least one virtual design element comprises a border of the memorial product.

11. The system of claim 7, wherein the at least one virtual three-dimensional memorial product and the at least one virtual design element are selected based on the cemetery operator.

12. The system of claim 1, wherein the computer-readable storage medium contains one or more programming instructions that, when executed, further cause the processor to:
receive patron information,
wherein the at least one virtual three-dimensional memorial product is generated based on the subject information, the customer information, and the patron information.

13. The system of claim 1, wherein the computer-readable storage medium contains one or more programming instructions that, when executed, further cause the processor to:
print or produce the physical three-dimensional memorial product based on the at least one virtual three-dimensional memorial product.

14. A system for generating a memorial product, the system comprising:
a processor; and
a non-transitory, computer-readable storage medium in operable communication with the processor, wherein the computer-readable storage medium contains one or more programming instructions that, when executed, cause the processor to:
generate a virtual three-dimensional memorial product, wherein the three-dimensional memorial product comprises at least one of a grave marker, a headstone, an urn, a vase, a plaque, a medal, a trophy, a sculpture, a statue, a scroll, granite, a niche plate, a crypt plate, crypt text, emblems, or a casket, wherein the virtual three-dimensional memorial product comprises one or more design elements and one or more memorial product characteristics, in response to receiving a memorial product template selection from a client logic device, wherein the client logic device includes a display device and, wherein the display device comprises a web-based interface,
restrict a combination of the one or more design elements and the one or more memorial product characteristics based on design rule information,
add at least one virtual design element to the virtual three-dimensional memorial product using at least one design function in response to receiving at least one design element selection from the client logic device, wherein the at least one design function comprises a collision detection design function configured to detect whether a threshold distance exists between the one or more design elements and to detect whether each of the one or more design elements is affixed to a portion of the least one virtual three-dimensional memorial product,
transmit for display, on the client display device, via the web-based interface, the virtual three-dimensional memorial product, and
generate an order for a physical three-dimensional memorial product based on the virtual three-dimensional memorial product, wherein the virtual three-dimensional memorial product is usable by a computing device to automatically print or produce at least part of the physical three-dimensional memorial product.

15. The system of claim 14, wherein the memorial product comprises a cast bronze memorial product.

16. The system of claim 14, wherein the at least one design function is a target location design function that is configured to select at least one target location based on at least one of a template, a customary placement location, a placement of at least one other virtual design element.

17. The system of claim 14, wherein the at least one design function is a placeholder design function that is configured to represent a virtual design element not included in a system design element inventory.

18. The system of claim 14, wherein the computer-readable storage medium contains one or more programming instructions that, when executed, further cause the processor to:
receive subject information and customer information,
wherein the virtual three-dimensional memorial product is generated based on the subject information and the customer information.

19. The system of claim 14, wherein the computer-readable storage medium contains one or more programming instructions that, when executed, further cause the processor to:
receive order information comprising historical order information,
wherein the virtual three-dimensional memorial product is generated based on subject information, customer information, and order information.

20. The system of claim 14, wherein the computer-readable storage medium contains one or more programming instructions, that, when executed, further cause the processor to:
print or produce the physical three-dimensional memorial product based on the virtual three-dimensional memorial product.

21. The system of claim 1, wherein the processor and display device are remotely located and communicate via the Internet.

* * * * *